US011251059B2

(12) United States Patent
Moura et al.

(10) Patent No.: US 11,251,059 B2
(45) Date of Patent: Feb. 15, 2022

(54) METHOD AND APPARATUS FOR SUBSTRATE TRANSPORT APPARATUS POSITION COMPENSATION

(71) Applicant: Brooks Automation, Inc., Chelmsford, MA (US)

(72) Inventors: Jairo T. Moura, Marlborough, MA (US); Robert T. Caveney, Windham, NH (US); Bing Yin, Southborough, MA (US); Nathan Spiker, Boston, MA (US); Vincent W. Tsang, Lincoln, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 85 days.

(21) Appl. No.: 16/872,864

(22) Filed: May 12, 2020

(65) Prior Publication Data
US 2020/0273734 A1 Aug. 27, 2020

Related U.S. Application Data

(62) Division of application No. 15/880,387, filed on Jan. 25, 2018, now Pat. No. 10,651,067.
(Continued)

(51) Int. Cl.
*H01L 21/677* (2006.01)
*H01L 21/68* (2006.01)
(Continued)

(52) U.S. Cl.
CPC ...... *H01L 21/67742* (2013.01); *B25J 9/0027* (2013.01); *B25J 9/107* (2013.01); *B25J 9/126* (2013.01); *B25J 9/1605* (2013.01); *B25J 11/0095* (2013.01); *G05B 19/4189* (2013.01); *H01L 21/67161* (2013.01); *H01L 21/67196* (2013.01); *H01L 21/681* (2013.01)

(58) Field of Classification Search
CPC combination set(s) only.
See application file for complete search history.

(56) References Cited

U.S. PATENT DOCUMENTS 6,401,554 B1 * 6/2002 Mori ................. H01L 21/67288
73/865.9
8,874,258 B2 10/2014 Hosek
(Continued)

*Primary Examiner* — Kyle O Logan
(74) *Attorney, Agent, or Firm* — Perman & Green LLP; Colin C. Durham

(57) ABSTRACT

A substrate transport empiric arm droop mapping apparatus for a substrate transport system of a processing tool, the mapping apparatus including a frame, an interface disposed on the frame forming datum features representative of a substrate transport space in the processing tool defined by the substrate transport system, a substrate transport arm, that is articulated and has a substrate holder, mounted to the frame in a predetermined relation to at least one of the datum features, and a registration system disposed with respect to the substrate transport arm and at least one datum feature so that the registration system registers, in an arm droop distance register, empiric arm droop distance, due to arm droop changes, between a first arm position and a second arm position different than the first arm position and in which the substrate holder is moved in the transport space along at least one axis of motion.

30 Claims, 22 Drawing Sheets

Related U.S. Application Data

(60) Provisional application No. 62/450,818, filed on Jan. 26, 2017.

(51) Int. Cl.
  *B25J 9/00* (2006.01)
  *B25J 11/00* (2006.01)
  *B25J 9/10* (2006.01)
  *H01L 21/67* (2006.01)
  *B25J 9/12* (2006.01)
  *B25J 9/16* (2006.01)
  *G05B 19/418* (2006.01)

(56) References Cited

U.S. PATENT DOCUMENTS

| | | | | |
|---|---|---|---|---|
| 9,030,656 B2 * | 5/2015 | Kajiwara | .......... | H01L 21/67742 356/237.1 |
| 9,401,296 B2 * | 7/2016 | Hosek | .................. | H01L 21/683 |
| 10,058,996 B2 * | 8/2018 | Hosek | .................... | B25J 9/1638 |
| 2004/0068347 A1 * | 4/2004 | Aalund | ............ | H01L 21/67265 700/245 |
| 2006/0045665 A1 * | 3/2006 | Hall | .................. | H01L 21/67196 414/217 |
| 2006/0099063 A1 * | 5/2006 | Pietrantonio | ......... | H01L 21/677 414/744.5 |
| 2006/0222477 A1 * | 10/2006 | Moura | .................... | H01L 21/68 414/217 |
| 2008/0219815 A1 * | 9/2008 | Brodine | ............ | H01L 21/67742 414/225.01 |
| 2010/0119349 A1 * | 5/2010 | Hofmeister | ............ | B25J 19/022 414/800 |
| 2010/0158644 A1 * | 6/2010 | Takizawa | .......... | H01L 21/67265 414/222.02 |
| 2012/0306139 A1 * | 12/2012 | Keigler | ............... | H01L 21/6776 269/254 R |
| 2015/0179491 A1 * | 6/2015 | Katsuda | ............ | H01L 21/67742 700/213 |
| 2016/0129586 A1 * | 5/2016 | Moura | ............. | H01L 21/67742 700/228 |
| 2016/0136812 A1 | 5/2016 | Hosek et al. | | |

* cited by examiner

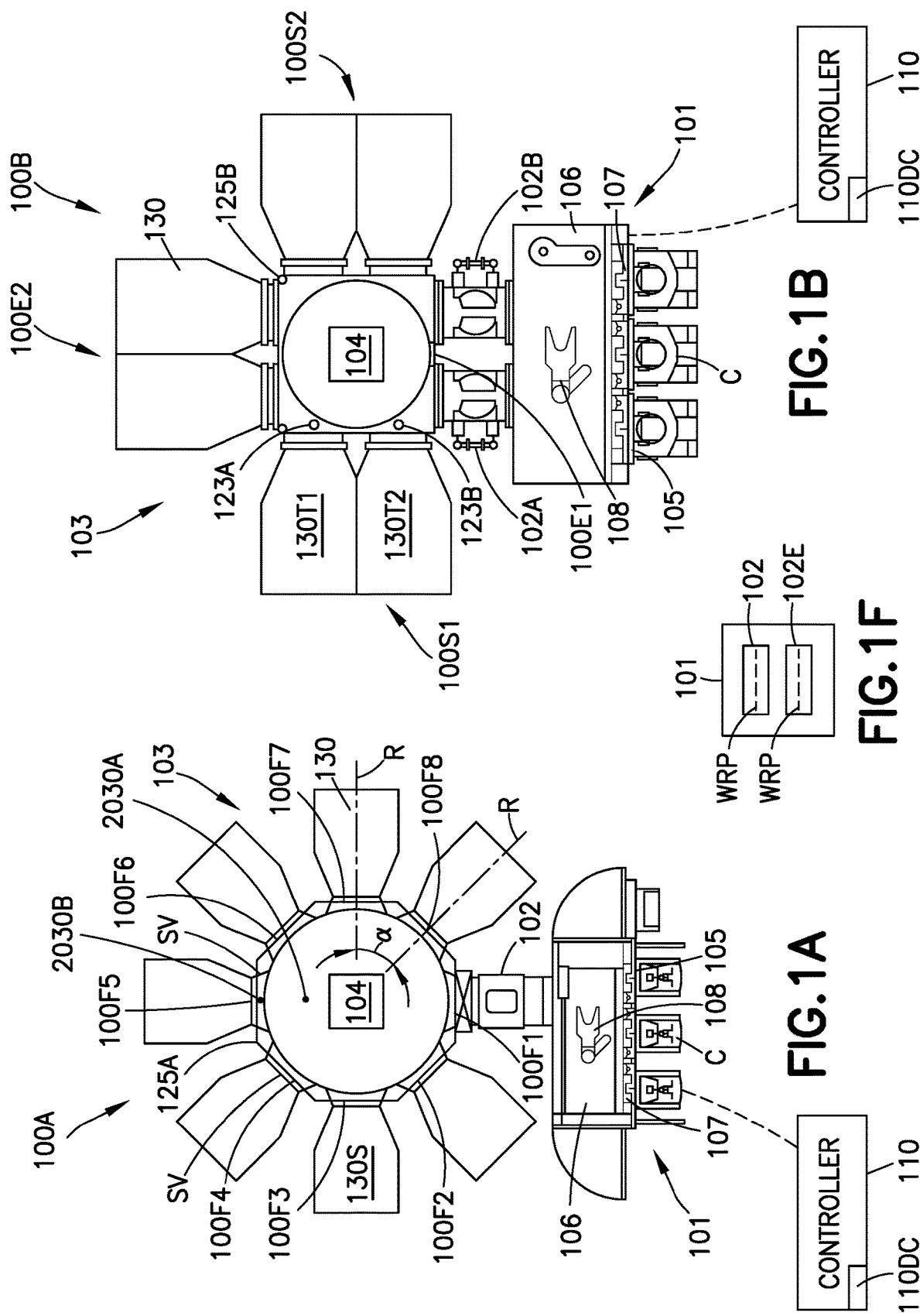

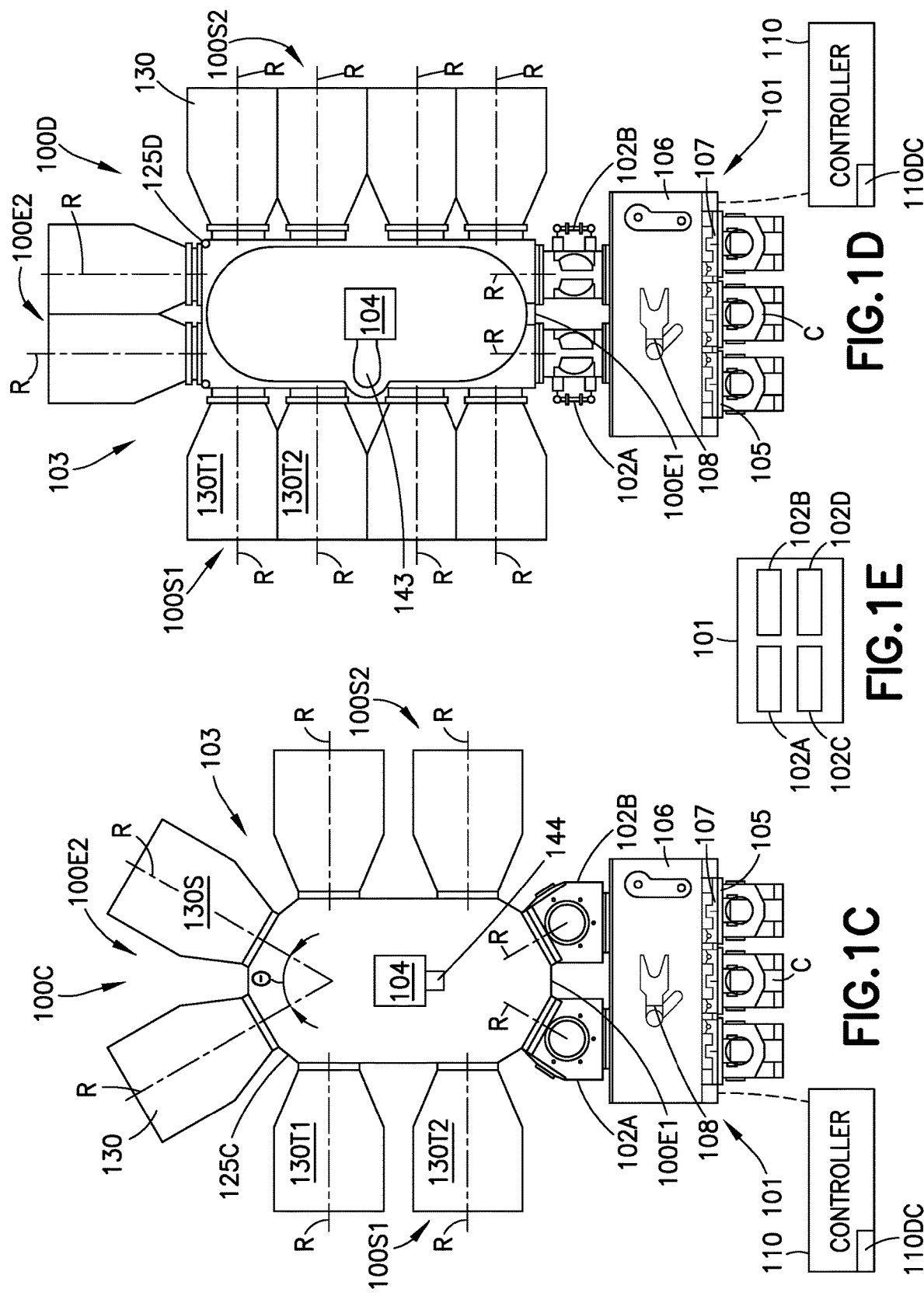

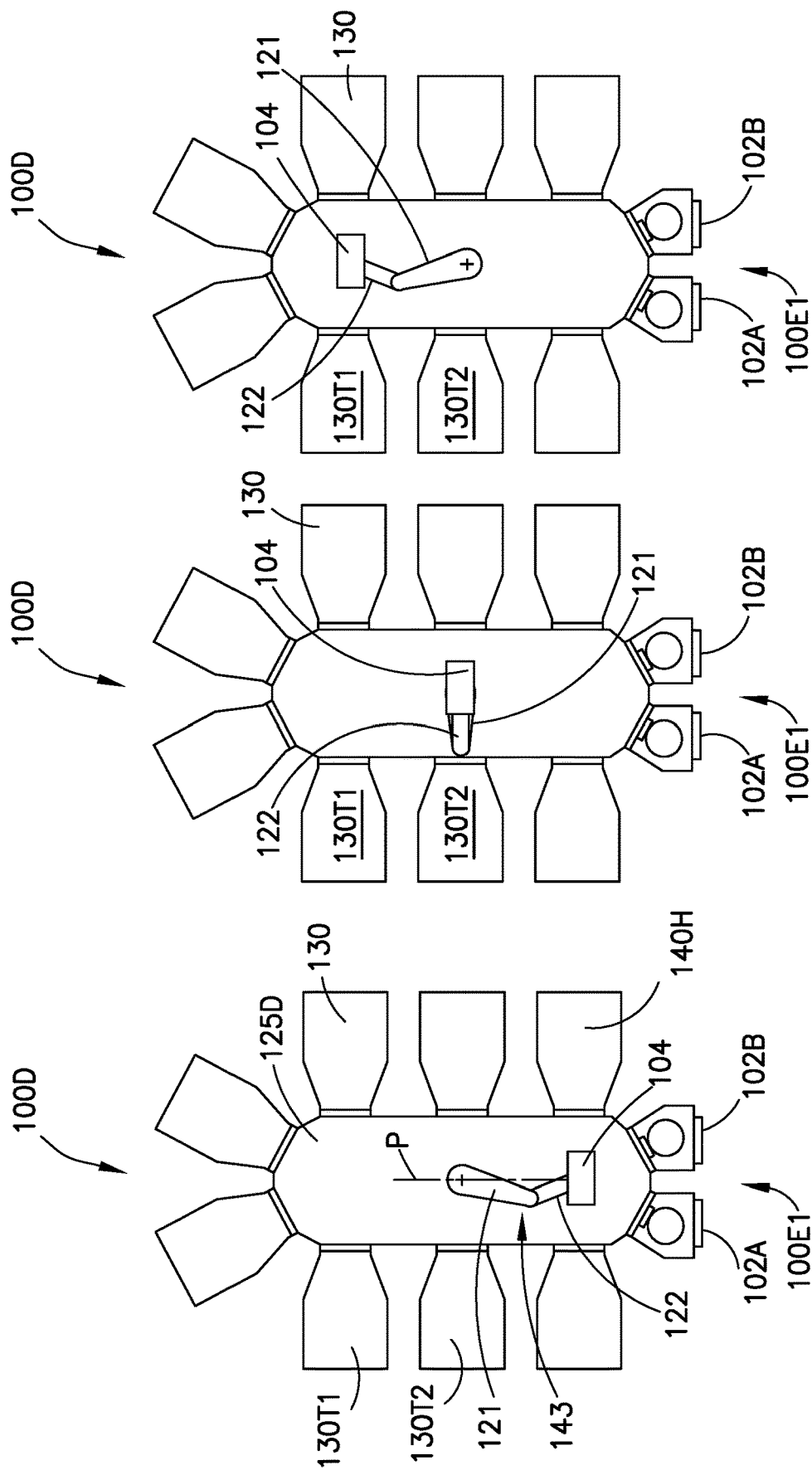

METHOD AND APPARATUS FOR SUBSTRATE TRANSPORT APPARATUS POSITION COMPENSATION

CROSS-REFERENCE TO RELATED APPLICATIONS

This application is a division of and claims the benefit of U.S. patent application Ser. No. 15/880,387, filed on Jan. 25, 2018, (now U.S. Pat. No. 10,651,067, issued on May 12, 2020), and U.S. provisional patent application No. 62/450,818, filed on Jan. 26, 2017, the disclosures of which are incorporated herein by reference in their entirety.

BACKGROUND

1. Field

The exemplary embodiments generally relate to robotic systems and, more particularly, to robotic transport apparatus.

2. Brief Description of Related Developments

More precise repeatability regarding substrate positioning is desired in, for example, semiconductor substrate processing. For example, semiconductor substrate transport apparatus design has evolved to applications that have ever increasing throughput demands, higher process module temperatures and smaller transport openings between process modules of a processing apparatus. One aspect in particular, the smaller transport openings constrains the allowable vertical displacement of the transport apparatus end effector as the end effector passes through the transport opening to enter and exit the process module. As a result, the mechanical design of the substrate transport apparatus is challenged by the choice of materials and arm link geometries that maximize static and dynamic stiffness of individual arm links as well as the end effector. The choices of materials and arm link geometries may lead to high costs and may not achieve the targeted vertical displacement.

It would be advantageous to provide a substrate transport apparatus that overcomes the above problems that minimizes the vertical displacement of the end effector, and substrate thereon, as the substrate transport apparatus extends and retracts to predetermined locations within the processing apparatus.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of processing apparatus incorporating aspects of the disclosed embodiment;

FIGS. 1E and 1F are schematic illustrations of portions of the processing apparatus of FIGS. 1A-1D and 1G-1M;

FIGS. 1G-1M are schematic illustrations of processing apparatus incorporating aspects of the disclosed embodiment;

DETAILED DESCRIPTION

FIGS. 1A-1M are schematic illustrations of substrate processing apparatus in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Figure 4A:
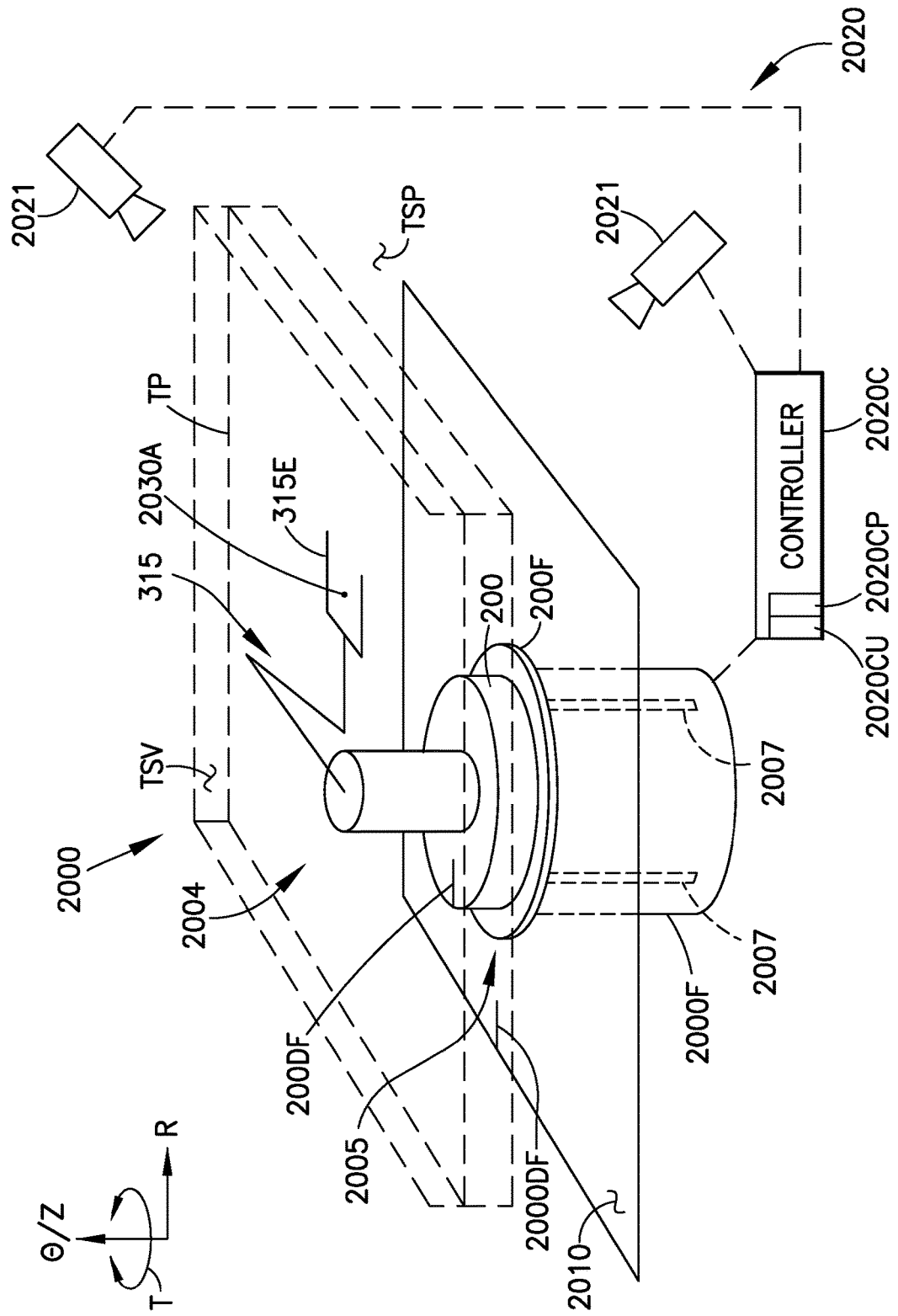
FIGS. 4A-4C are schematic illustrations of a substrate transport arm droop mapping apparatus in accordance with aspects of the disclosed embodiment.
Figure 4B:
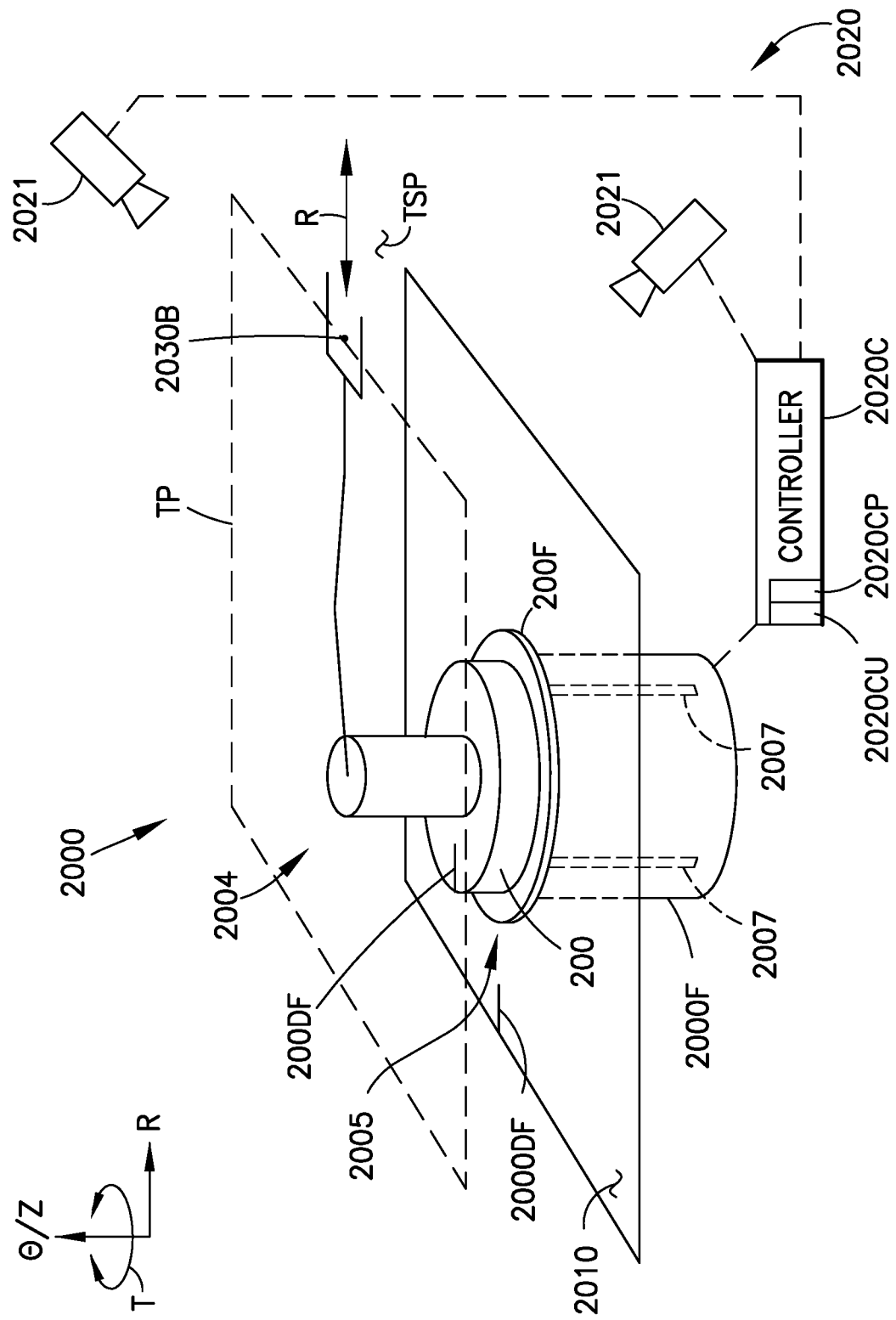

The aspects of the disclosed embodiment provide for methods and apparatus that effect transport arm position compensation so that the end effector of the transport arm, and substrate carried thereon, extends substantially along a wafer transport plane without substantial deviation from the wafer transport plane as the transport arm is extended. For example, referring also to FIG. 4D, substrate S travels within a substrate processing apparatus along a predetermined reference datum plane, referred to herein as the transfer plane TP. In one aspect, the transfer plane TP is, for example, a horizontal plane corresponding to a plane in which the substrate S is held by a transport arm with the transport arm retracted; while in other aspects the transport plane TP may correspond with a path through a slot valve or any suitable substrate holding location within the substrate processing apparatus. In one aspect, the transport plane TP extends or spans the entirety of, for example, a substrate transport chamber in which the transport arm is located.

In one aspect, the transfer plane TP is aligned with slot valves SV of the substrate transport chamber and defines, at least in part a plane along which the substrate S travels through the slot valves SV to different portions of the substrate processing tool. As, for example, transport arm 315 (as well as the other transport arm described herein) extends to transport a substrate S through the slot valve SV the transport arm flexes or droops such that a position of the substrate S deviates from the transport plane by a droop distance DRP. It is noted that the term "droop" is used herein as a matter of convenience to describe uncommanded gross/ unexcited Z direction displacement or "sag" of a portion of the transport arm from a reference datum plane such as the wafer transfer plane TP.

The droop distance DRP of the transport arm 315 depends on a number of factors. For example, the droop distance DRP may be a combination of one or more of a deflection of the transport arm 315 links due to bending caused from loads (e.g. weight of the substrate and/or arm links) effected on a sprung arm component, the drive section 200 and/or transport arm payload, bending and twisting effected on the transport arm from drive loads and kinematic effects from un-orthogonality variances of the rotation axes T1, T2, T3, etc. of the transport arm 315 joints relative to a horizontal plane (such as the transfer plane TP) and/or un-orthogonality of the drive spindles of the drive section 200 relative to each other and the transfer plane TP.

As may be realized, the resultant droop distance DRP is variable with transport arm 315 extension position along extension axis R, transport arm rotation in direction T about the axis θ, a lift or Z position of the transport arm along the Z axis, as well as other environmental factors such as arm temperature (noting thermal expansion and contraction of arm links and other components of transport arm including the drive section). As described above, increasing throughput of substrate processing apparatus such as processing apparatus 100A, 100B, 100C, 100D, 100E, 100F, 100G, 100H, demands dimensional constraints on allowable droop. For example, to increase throughput, heights SVH of the slot valve SV aperture may be made smaller to decrease an amount of time to open and close the slot valve. This reduced height SVH decreases an amount of clearance between the transport apparatus 315 end effector (e.g. clearance between a substrate held on the end effector and the slot valve, clearance between a wrist joint of the end effector and the slot valve, etc.) and the slot valve SV, especially in cases due to process module arrangement and transport arm/end effector configuration (e.g. short end effector wrist W to pan distances where part of the wrist W extends through the slot valve—noting that the wrist W is the joint at which the end effector is coupled to the rest of the transport arm). In another aspect, a reduced Z-stroke between the end effector and substrate holding station is desired to decrease substrate handoff times. This reduced Z-stroke demands placing the end effector, and substrate thereon, closer to the substrate holding station.

The droop distance DRP, as described above, is defined by a combination of linear and highly non-linear factors so that prediction of the droop distance DRP by classic analytical means is inadequate. The aspects of the disclosed embodiment provide a substrate transport arm droop mapping apparatus 2000 (see FIGS. 4A-4C) that is configured to map the droop distance DRP during extension of the transport arm 315 in the R direction in combination with a rotational orientation of the arm in the T direction along the different extension and retraction axes of the processing apparatus 100A, 100B, 100C, 100D, 100E, 100F, 100G, 100H in which the transport arm 315 operates. The aspects, of the disclosed embodiment also provide for a transport apparatus and substrate processing apparatus in which the transport apparatus is located that are configured to compensate for arm droop during operation of the transport apparatus. The aspects of the disclosed embodiment also provide for methods of operating the substrate processing apparatus and the transport apparatus disposed therein to compensate for arm droop. The aspects of the disclosed embodiment provide for increased precision in placemen of the transport apparatus end effector, and substrate thereon, so that throughput of the substrate processing apparatus is increased.

Figure 1J:
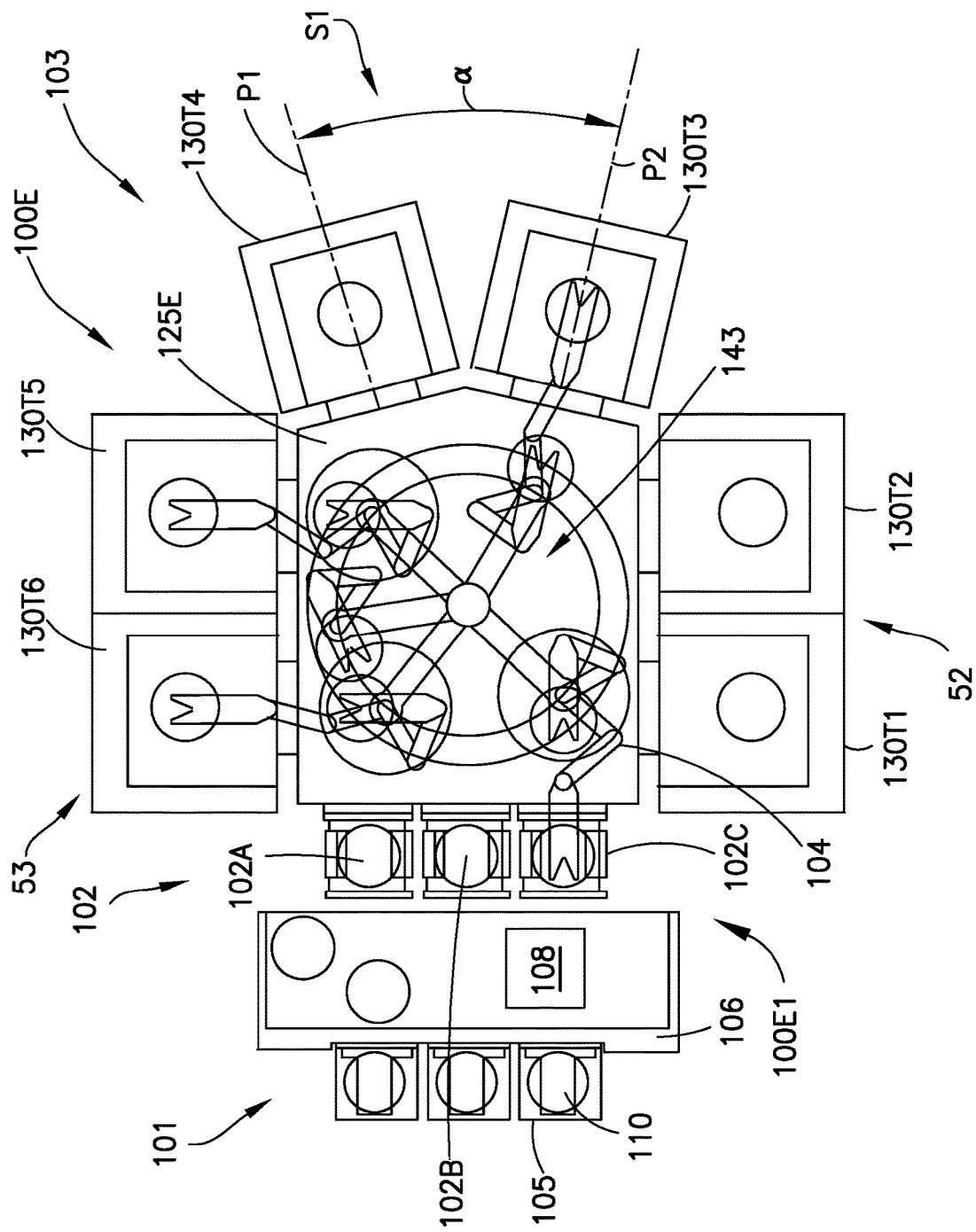
Figure 1K:
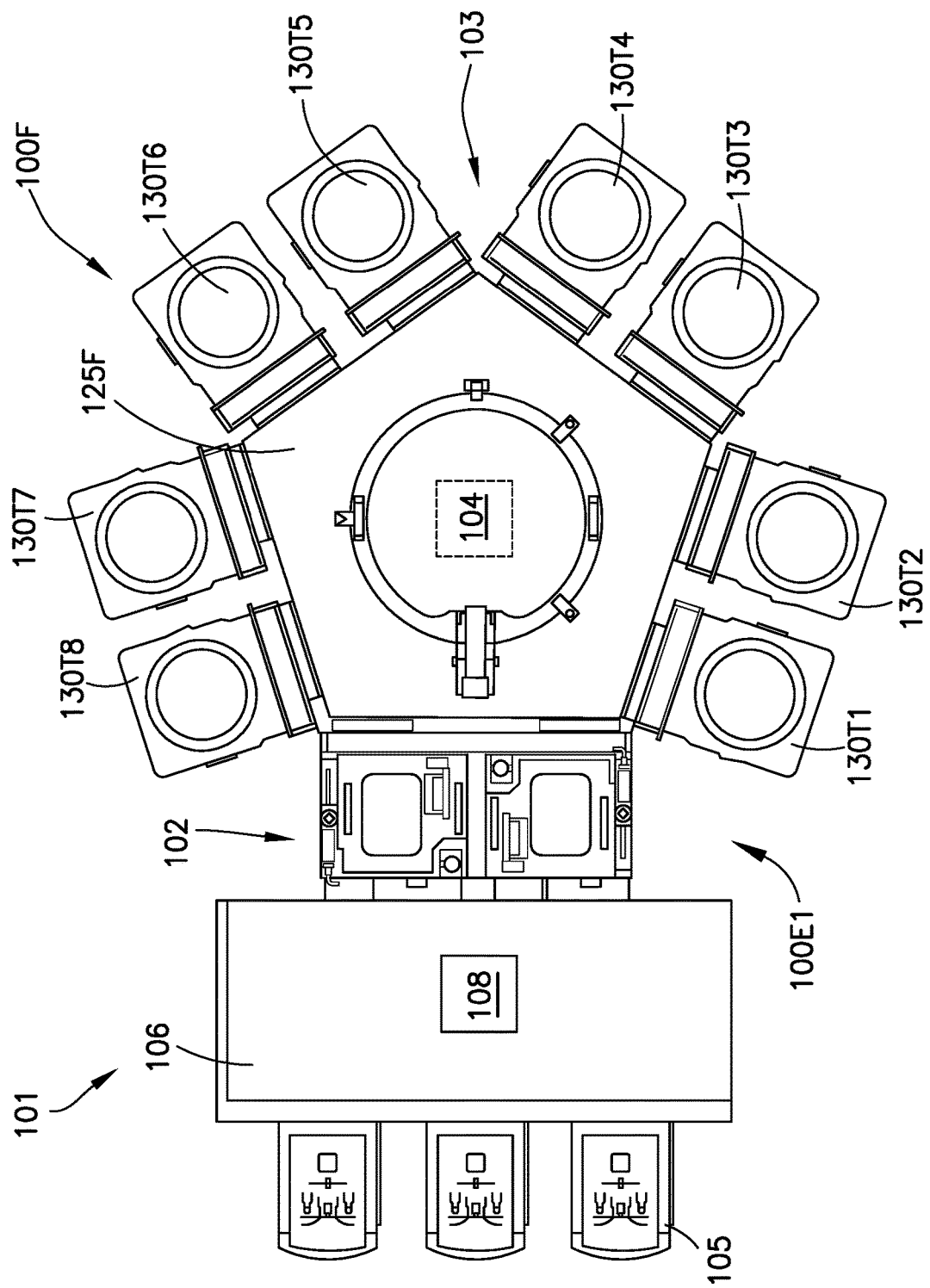

The processing apparatus 100A, 100B, 100C, 100D, 100E, 100F, 100G, 100H such as for example a semiconductor tool station, is shown in accordance with aspects of the disclosed embodiment. Although a semiconductor tool station is shown in the drawings, the aspects of the disclosed embodiment described herein can be applied to any tool station or application employing robotic manipulators. In one aspect the processing apparatus 100A, 100B, 100C, 100D, 100E, 100F are shown as having cluster tool arrangements (e.g. having substrate holding stations connected to a central chamber) while in other aspects the processing apparatus may be a linearly arranged tool 100G, 100H, as described in U.S. Pat. No. 8,398,355, entitled "Linearly Distributed Semiconductor Workpiece Processing Tool," issued Mar. 19, 2013 (the disclosure of which is incorporated herein by reference in its entirety); however the aspects of the disclosed embodiment may be applied to any suitable tool station. The apparatus 100A, 100B, 100C, 100D, 100E, 100F, 100G, 100H generally include an atmospheric front end 101, at least one vacuum load lock 102, 102A, 102B, 102C and a vacuum back end 103. The at least one vacuum load lock 102, 102A, 102B, 102C may be coupled to any suitable port(s) or opening(s) of the front end 101 and/or back end 103 in any suitable arrangement. For example, in one aspect the one or more load locks 102, 102A, 102B, 102C may be arranged in a common horizontal plane in a side by side arrangement as can be seen in FIGS. 1B-1D and 1G-1K. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D in other aspects the one or more load lock may be arranged on any number of sides 100S1, 100S2, ends 100E1, 100E2 or facets 100F1-100F8 of the transport chamber 125A, 125B, 125C, 125D. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B, 102C and back end 103 may be connected to a controller 110 which may be part of any suitable control architecture such as, for example, a clustered architecture control. The control system may be a closed loop controller having a master controller (which in one aspect may be controller 110), cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, 1J and 1K, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B, 102C may be located between and connected to the mini-environment 106 and the back end 103. In other aspects the load ports 105 may be coupled substantially directly to the at least one load lock 102, 102A, 102B, 102C or the transport chamber 125A, 125B, 125C, 125D, 125E, 125F where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock or otherwise have access to the carrier C for transferring substrates to and from the substrate carrier C. It is noted that the term vacuum as used herein may denote a high vacuum such as $10^{-5}$ Torr or below in which the substrates are processed. The at least one load lock 102, 102A, 102B, 102C generally includes atmospheric and vacuum slot valves. The slot valves of the load locks 102, 102A, 102B (as well as for the processing stations 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D, 100E, 100F (as well as linear processing apparatus 100G, 100H) may be located in the same plane, different vertically stacked planes or a combination of slot valves located in the same plane and slot valves located in different vertically stacked planes (as described above with respect to the load ports) to accommodate transfer of substrates to and from at least the processing stations 130 and load locks 102, 102A, 102B, 102C coupled to the transport chamber 125A, 125B, 125C, 125D, 125E, 125F. The at least one load lock 102, 102A, 102B, 102C (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, 125E, 125F one or more processing station(s) or module(s) 130 and any suitable number of transport unit modules 104 that includes one or more transport robots which may include one or more aspects of the disclosed embodiments described herein. The transport chamber 125A, 125B, 125C, 125D, 125E, 125F may have any suitable shape and size that, for example, complies with SEMI standard E72 guidelines. The transport unit module(s) 104 and the one or more transport robot will be described below and may be located at least partly within the transport chamber 125A, 125B, 125C, 125D, 125E, 125F to transport substrates between the load lock 102, 102A, 102B, 120C (or between a cassette C located at a load port) and the various processing stations 130. In one aspect the transport unit module 104 may be removable from the transport chamber 125A, 125B, 125C, 125D, 125E, 125F as modular unit such that the transport unit module 104 complies with SEMI standard E72 guidelines.

The processing stations 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 130 are communicably connected to the transport chamber 125A, 125B, 125C, 125D, 125E, 125F in any suitable manner, such as through slot valves SV, to allow substrates to be passed from the transport chamber 125A, 125B, 125C, 125D, 125E, 125F to the processing stations 130 and vice versa. The slot valves SV of the transport chamber 125A, 125B, 125C, 125D, 125E, 125F may be arranged to allow for the connection of twin (e.g. more than one substrate processing chamber located within a common housing) or side-by-side process stations 130T1-130T8, single process stations 130S and/or stacked process modules/load locks (FIGS. 1E and 1F).

It is noted that the transfer of substrates to and from the processing station 130, load locks 102, 102A, 102B, 102C (or cassette C) coupled to the transfer chamber 125A, 125B, 125C, 125D, 125E, 125F may occur when one or more arms of the transport unit module 104 are aligned with a predetermined processing station 130 along an axis of extension and retraction R of the transport unit module 104. In accordance with aspects of the disclosed embodiment one or more substrates may be transferred to a respective predetermined processing station 130 individually or substantially simultaneously (e.g. such as when substrates are picked/placed from side-by-side or tandem processing stations as shown in FIGS. 1B, 1C, 1D and 1G-1K. In one aspect the transport unit module 104 may be mounted on a boom arm 143 (see e.g. FIGS. 1D and 1G-1I), where the boom arm 143 has a single boom link or multiple boom links 121, 122, or linear carriage 144 such as that described in U.S. provisional patent application Nos. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 1L:
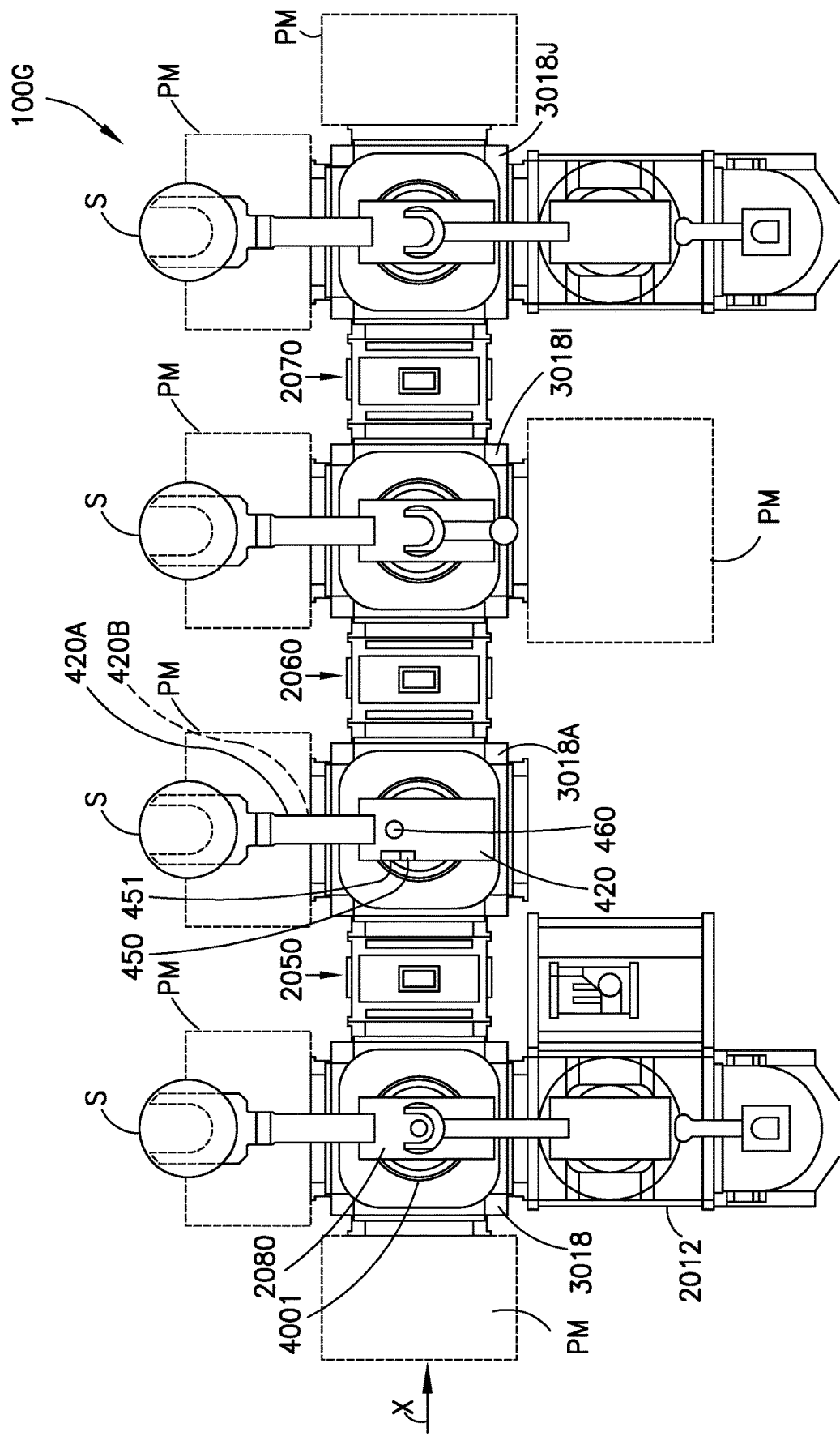

Referring now to FIG. 1L, a schematic plan view of a linear wafer processing system 100G is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. Pat. No. 8,398,355, previously incorporated herein by reference. Each transport chamber module 3018, 3018A, 3018I, 3018J includes any suitable wafer transport 2080, which may include one or more aspects of the disclosed embodiment described herein, for transporting wafers throughout the processing system 100G and into and out of, for example, processing modules PM. As may be realized, each chamber module may be capable of holding an isolated or controlled atmosphere (e.g. N2, clean air, vacuum).

Figure 1M:
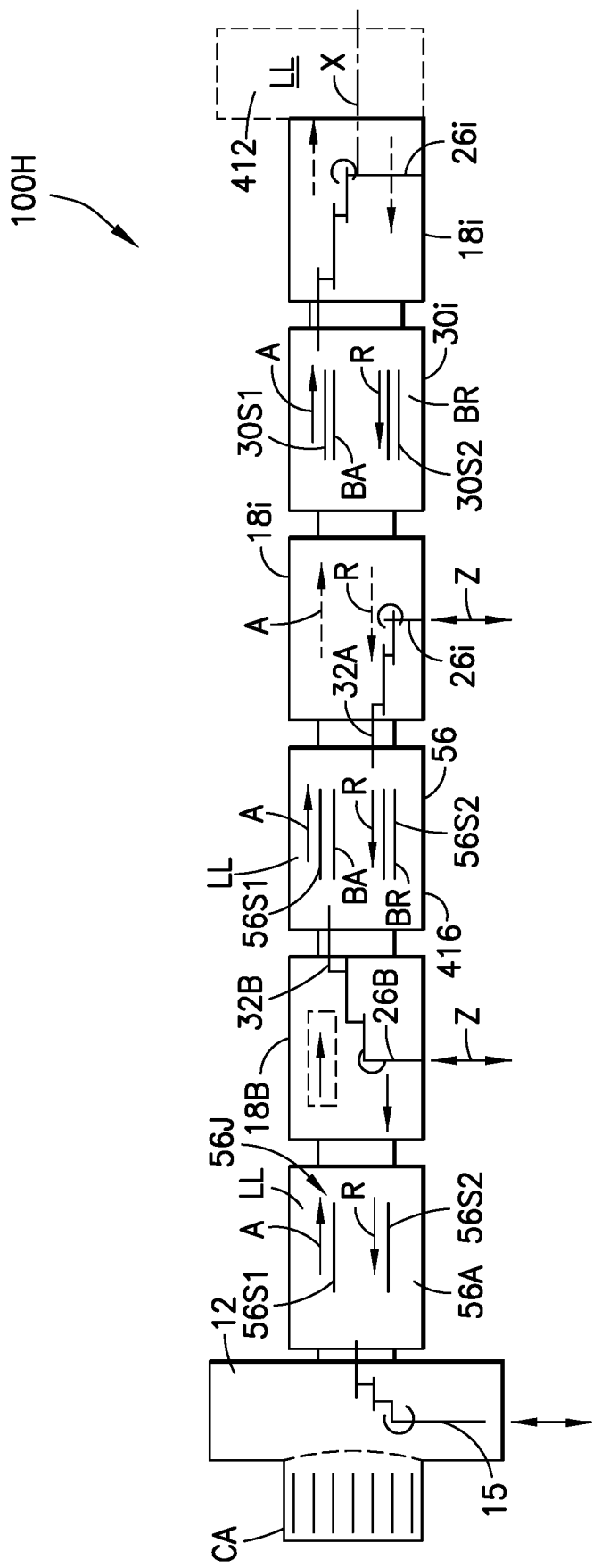

Referring to FIG. 1M, there is shown a schematic elevation view of an exemplary processing tool 100H such as may be taken along longitudinal axis X of the linear transport chamber 416. In the aspect of the disclosed embodiment shown in FIG. 1M, tool interface section 12 may be representatively connected to the transport chamber 416. In this aspect, interface section 12 may define one end of the tool transport chamber 416. As seen in FIG. 1M, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56 and workpiece stations forming the transport chamber 416 shown in FIG. 1M is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock.

As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system 420 in the transport chamber. In this aspect, the transport apparatus 26B may have a general SCARA arm configuration (though in other aspects the transport arms may have any other desired arrangement as described below)

In the aspect of the disclosed embodiment shown in FIG. 1M, the arms and/or end effectors of the transport apparatus 26B may be arranged to provide what may be referred to as fast swap arrangement allowing the transport to quickly swap wafers from a pick/place location. The transport arm 26B may have any suitable drive section (e.g. coaxially arranged drive shafts, side by side drive shafts, horizontally adjacent motors, vertically stacked motors, etc.), for providing each arm with any suitable number of degrees of freedom (e.g. independent rotation about shoulder and elbow joints with Z axis motion). As seen in FIG. 1M, in this aspect the modules 56A, 56, 30i may be located interstitially between transfer chamber modules 18B, 18i and define suitable processing modules, load lock(s), buffer station(s), metrology station(s) or any other desired station(s). For example the interstitial modules, such as load locks 56A, 56 and workpiece station 30i, each have stationary workpiece supports/shelves 56S, 56S1, 56S2, 30S1, 30S2 that cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the wafers through various deposition, etching, or other types of processes to form electrical circuitry or other desired structure on the wafers. The processing station modules are connected to the transport chamber modules to allow wafers to be passed from the transport chamber to the processing stations and vice versa. A suitable example of a processing tool with similar general features to the processing apparatus depicted in FIG. 1D is described in U.S. Pat. No. 8,398,355, previously incorporated by reference in its entirety.

Referring now to FIGS. 2A, 2B, 2C, 2D in one aspect the transport unit module 104 includes at least one drive section 200, 200A, 200B, 200C and at least one transport arm portion having at least one transport arm, such as transport arms 314, 315, 316, 317, 318 described below. The transport arms 314, 315, 316, 317, 318 may be coupled to the drive shafts of the drive sections 200, 200A-200C in any suitable manner at any suitable connection CNX so that the rotation of the drive shafts effect movement of the transport arms 314, 315, 316, 317, 318 as described herein. As will be described below, in one aspect, the transport arms 314, 315, 316, 317, 318 are interchangeable from a number of different interchangeable transport arms 314, 315, 316, 317, 318 so as to be swapped at the connection CNX with the drive section, where each of the interchangeable arms 314, 315, 316, 317, 318 have different droop characteristics and a corresponding droop distance register 700 (see FIG. 7) associated therewith that describes the arm droop distance of the associated transport arm 314, 315, 316, 317, 318.

Figure 2A:
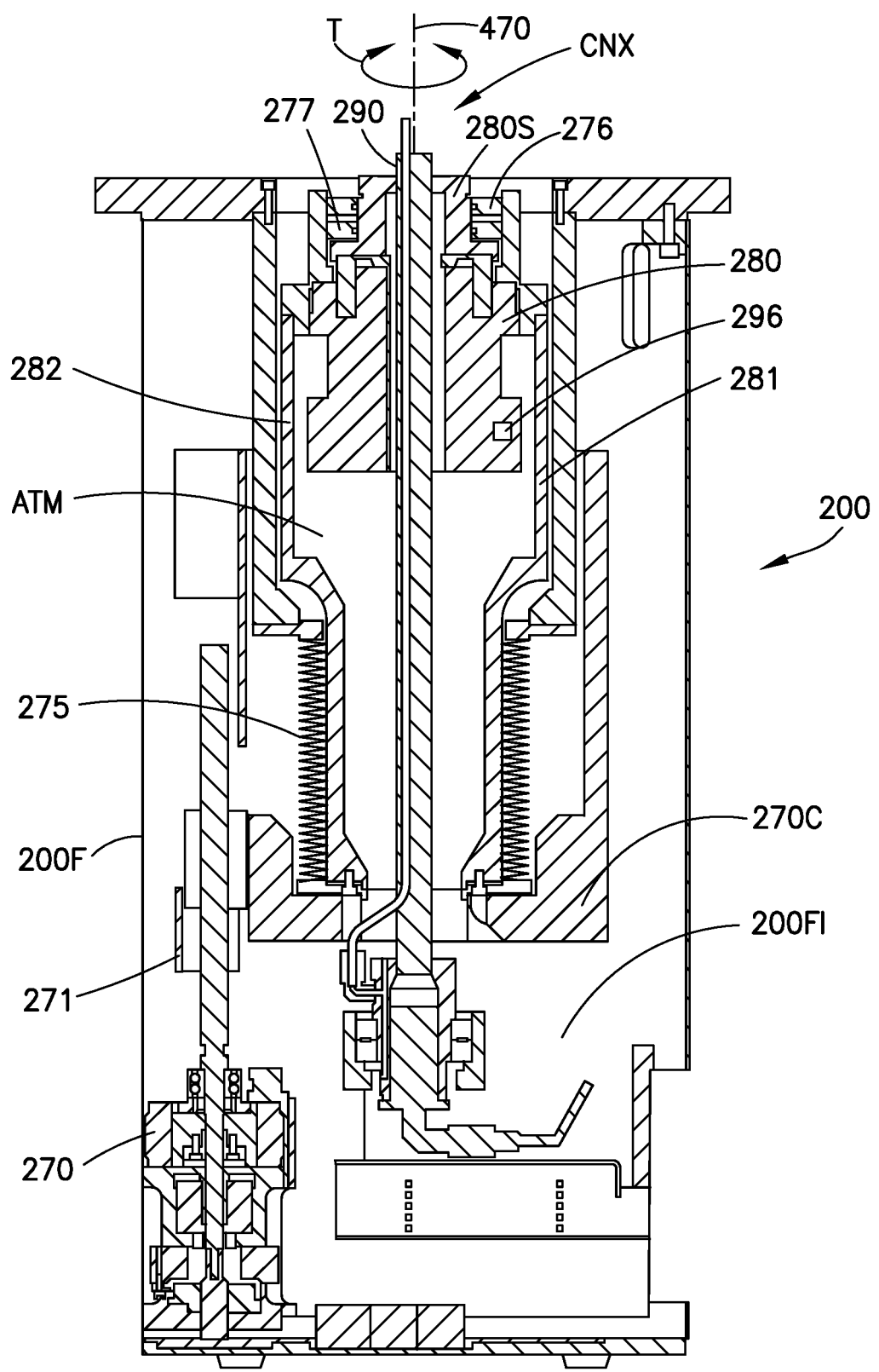
FIG. 2A is a schematic illustration of a robotic transport drive section in accordance with aspects of the disclosed embodiment.
Figure 2B:
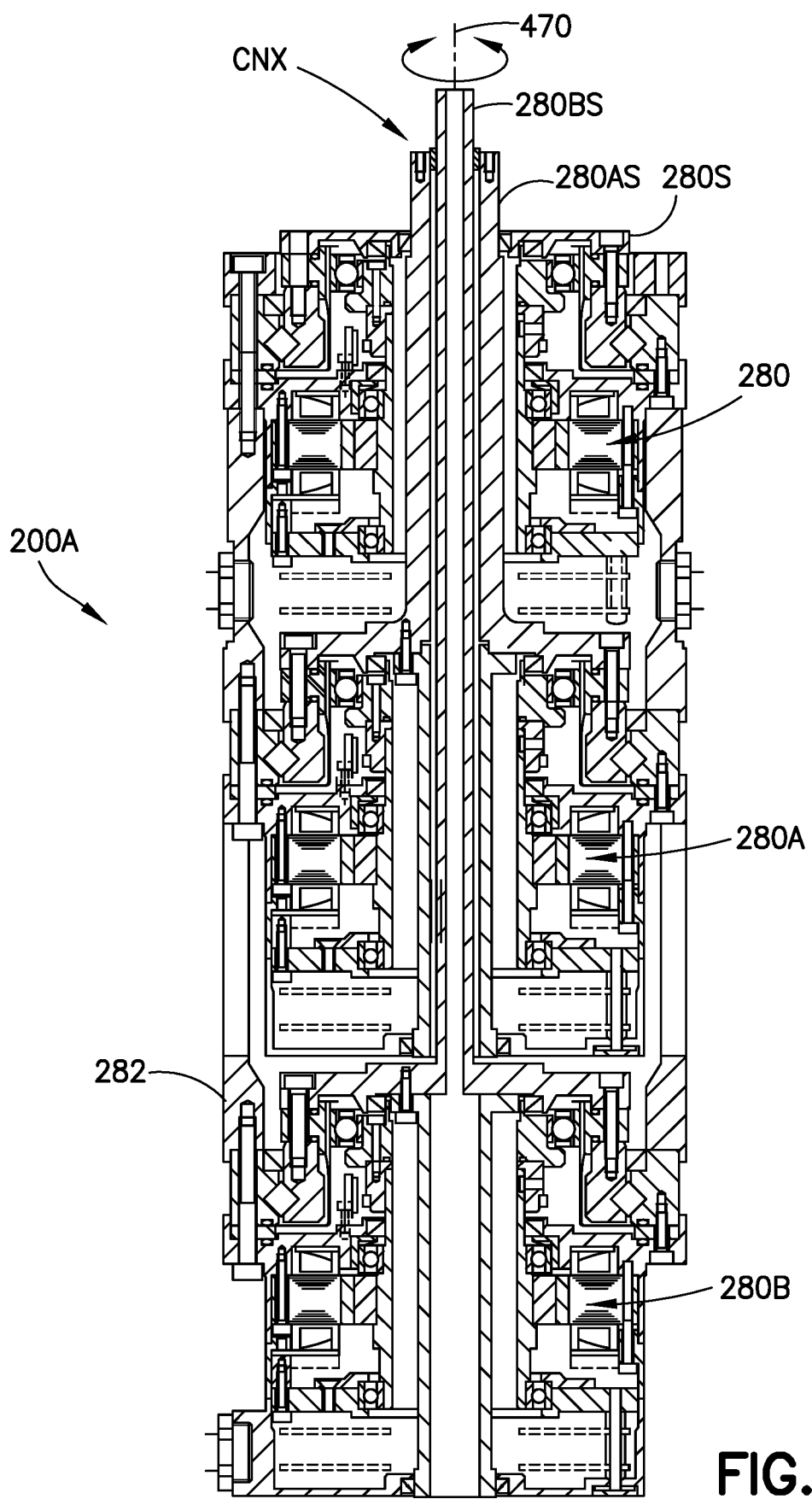
FIG. 2B is a schematic illustration of a portion of the robotic transport drive section of FIG. 2A in accordance with aspects of the disclosed embodiment.

The at least one drive section 200, 200A, 200B, 200C is mounted to any suitable frame of the processing apparatus 100A-100H. In one aspect, as noted above, the transport unit module 104 may be mounted to a linear slide 144 or boom arm 143 in any suitable manner where the linear slide and/or boom arm 143 has a drive section substantially similar to drive section 200, 200A, 200B, 200C described herein. The at least one drive section 200, 200A, 200B, 200C may include a common drive section that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the at least one transfer arm 300, 301 along the Z axis. The Z axis drive is illustrated in FIG. 2A as a screw type drive but in other aspects the drive may be any suitable linear drive such as a linear actuator, piezo motor, etc. The rotational drive section 282 may be configured as any suitable drive section such as, for example, a harmonic drive section. For example, the rotational drive section 282 may include any suitable number of coaxially arranged harmonic drive motors 280, such as can be seen in FIG. 2B where the drive section 282 includes three coaxially arranged harmonic drive motors 280, 280A, 280B. In other aspects the drives of drive section 282 may be located side-by-side and/or in a coaxial arrangement. In one aspect the rotational drive section 282 shown in FIG. 2A includes one harmonic drive motor 280 for driving shaft 280S however, in other aspects the drive section may include any suitable number of harmonic drive motors 280, 280A, 280B (FIG. 2B) corresponding to, for example, any suitable number of drive shafts 280S, 280AS, 280BS (FIG. 2B) in the coaxial drive system. The harmonic drive motor 280 may have high capacity output bearings such that the component pieces of a ferrofluidic seal 276, 277, are centered and supported at least in part by the harmonic drive motor 280 with sufficient stability and clearance during desired rotation T and extension R movements of the transport unit module 104. It is noted that the ferrofluidic seal 276, 277 may include several parts that form a substantially concentric coaxial seal as will be described below. In this example the rotational drive section 282 includes a housing 281 that houses one or more drive motor 280 which may be substantially similar to that described above and/or in U.S. Pat. Nos. 6,845,250; 5,899,658; 5,813,823; and 5,720,590, the disclosures of which are incorporated by reference herein in their entireties. The ferrofluidic seal 276, 277 can be toleranced to seal each drive shaft 280S, 280AS, 280BS in the drive shaft assembly. In one aspect a ferrofluidic seal may not be provided. For example, the drive section 282 may include drives having stators that are substantially sealed from the environment in which the transport arms operate while the rotors and drive shafts share the environment in which the arms operate. Suitable examples, of drive sections that do not have ferrofluidic seals and may be employed in the aspects of the disclosed embodiment include the Magna-Tran® 7 and MagnaTran® robot drive sections from Brooks Automation, Inc. which may have a sealed can arrangement as will be described below. It is noted that drive shaft(s) 280S, 280AS, 280BS may also have a hollow construction (e.g. has a hole running longitudinally along a center of the drive shaft) to allow for the passage of wires 290 or any other suitable items through the drive assembly for connection to, for example, another drive section as described in U.S. patent application Ser. No. 15/110,130 filed on Jul. 7, 2016 and published as US 2016/0325440 on Nov. 10, 2016, the disclosure of which is incorporated herein by reference in its entirety, any suitable position encoders, controllers, and/or the at least one transfer arm 314, 315, 316, 317, 318, mounted to the drive 200, 200A, 200B, 200C. As may be realized, each of the drive motors of drive section 200, 200A, 200B, 200C may include any suitable encoders configured to detect a position of the respective motor for determining a position of the end effector 314E, 315E, 316E, 317E1, 317E1, 318E1, 318E2 of each transport arm 314, 315, 316, 317, 318.

In one aspect the housing 281 may be mounted to a carriage 270C which is coupled to the Z axis drive 270 such that the Z axis drive 270 moves the carriage (and the housing 281 located thereon) along the Z axis. As may be realized, to seal the controlled atmosphere in which the at least one transfer arm 300, 301 operates from an interior of the drive 200, 200A, 200B, 200C (which may operate in an atmospheric pressure ATM environment) may include one or more of the ferrofluidic seal 276, 277 described above and a bellows seal 275. The bellows seal 275 may have one end coupled to the carriage 270C and another end coupled to any suitable portion of the frame 200FI so that the interior 200FI of the frame 200F is isolated from the controlled atmosphere in which the at least one transfer arm 300, 301 operates.

Figure 2C:
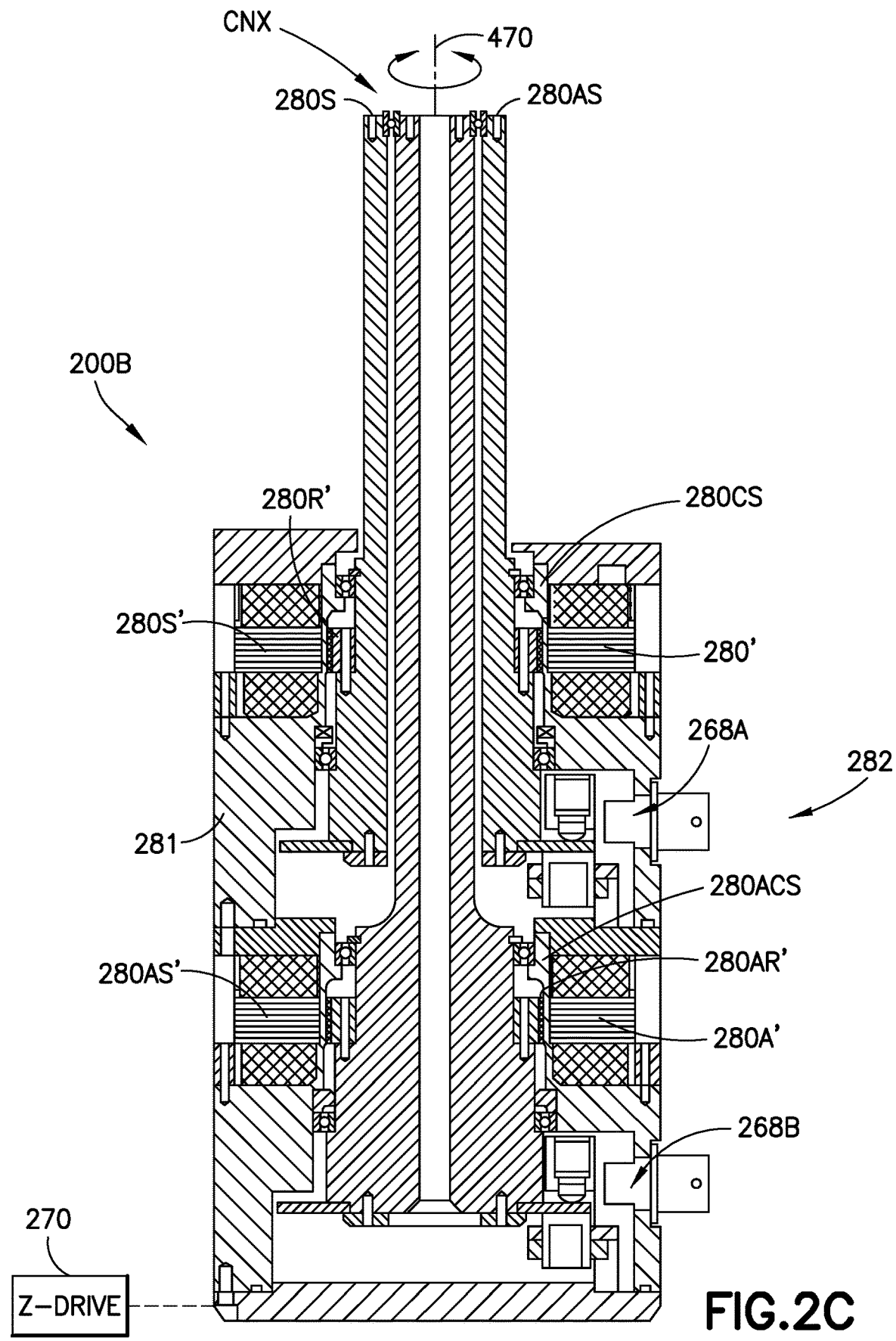
FIG. 2C is a schematic illustration of a portion of the robotic transport drive section of FIG. 2A in accordance with aspects of the disclosed embodiment.
Figure 2D:
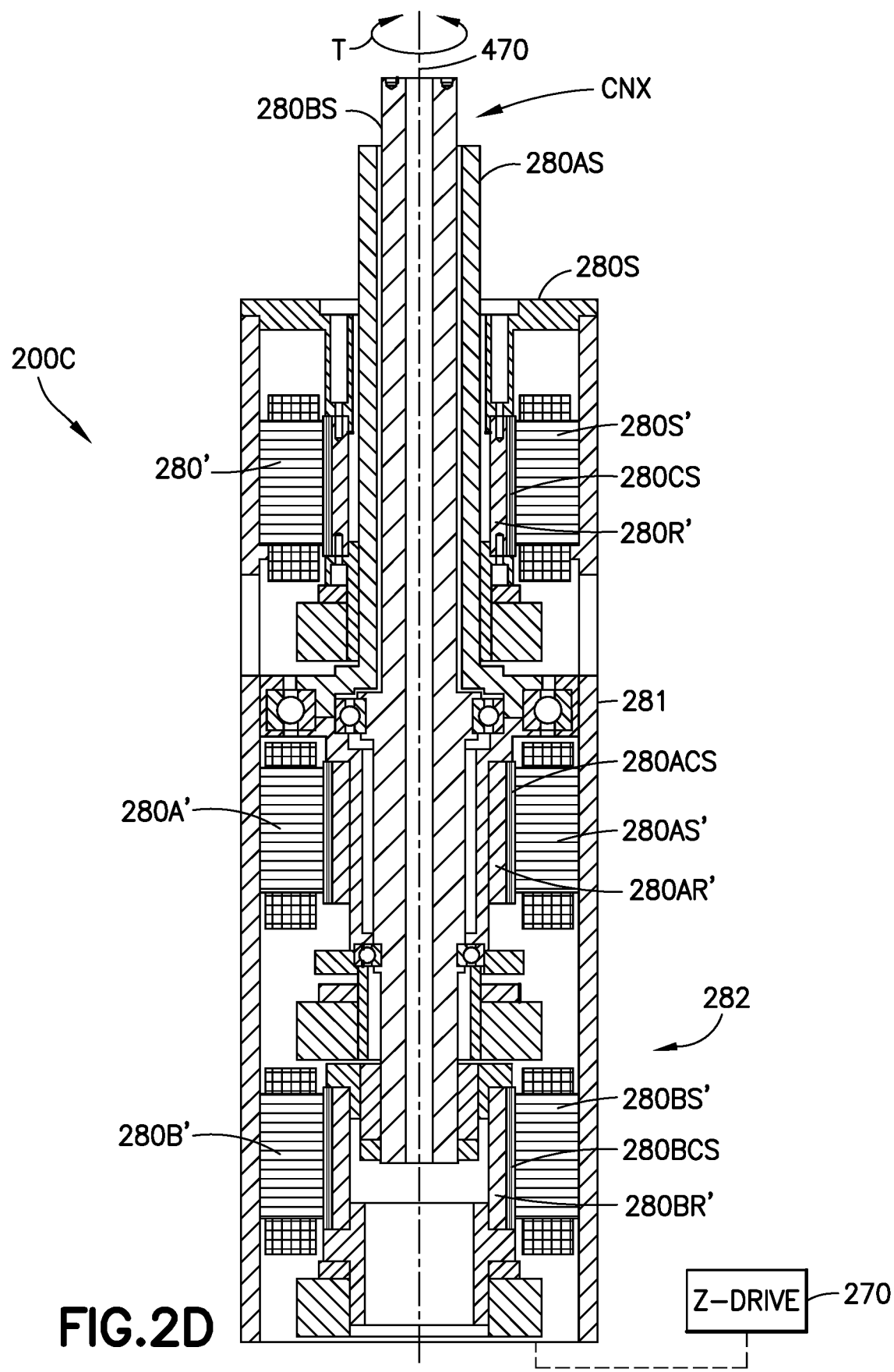
FIG. 2D is a schematic illustration of a portion of the robotic transport drive section of FIG. 2A in accordance with aspects of the disclosed embodiment.

In other aspects, as noted above, a drive having stators that are sealed from the atmosphere in which the transport arms operate without a ferrofluidic seal, such as the MagnaTran® 7 and MagnaTran® 8 robot drive sections from Brooks Automation, Inc., may be provided on the carriage 270C. For example, referring also to FIGS. 2C and 2D the rotational drive section 282 is configured so that the motor stators are sealed from the environment in which the robot arms operate while the motor rotors share the environment in which the robot arms operate. FIG. 2C illustrates a coaxial drive having a first drive motor 280' and a second drive motor 280A'. The first drive motor 280' has a stator 280S' and rotor 280R' where the rotor 280R' is coupled to drive shaft 280S. A can seal 280CS may be positioned between the stator 280S' and rotor 280R' and be connected to the housing 281 in any suitable manner so as to seal the stator 280S' from the environment in which the robot arms operate. Similarly the motor 280A' includes a stator 280AS' and rotor 280AR' where the rotor 280AR' is coupled to drive shaft 280AS. A can seal 280ACS may be disposed between the stator 280AS' and rotor 280AR'. The can seal 280ACS may be connected to the housing 281 in any suitable manner so as to seal the stator 280AS' from the environment in which the robot arms operate. As may be realized any suitable encoder/sensors 268A, 268B may be provided for determining a position of the drive shaft (and the arm(s) which the drive shaft(s) operates). Referring to FIG. 2D a tri-axial rotational drive section 282 is illustrated. The tri-axial rotational drive section may be substantially similar to the coaxial drive section described above with respect to FIG. 2C however, in this aspect there are three motors 280', 280A', 280B', each having a rotor 280R', 280AR', 280BR' coupled to a respective drive shaft 280A, 280AS, 280BS. Each motor also includes a respective stator 280S', 280AS', 280BS' sealed from the atmosphere in which the robot arm(s) operate by a respective can seal 280SC, 280ACS, 280BCS. As may be realized any suitable encoders/sensors may be provided as described above with respect to FIG. 2C for determining a position of the drive shaft (and the arm(s) which the drive shaft(s) operates). As may be realized, in one aspect the drive shafts of the motors illustrated in FIGS. 2C and 2D may not allow for wire 290 feed-through while in other aspects any suitable seals may be provided so that wires may be passed through, for example, hollow drive shafts of the motors illustrated in FIGS. 2C and 2D.

Figure 3A:
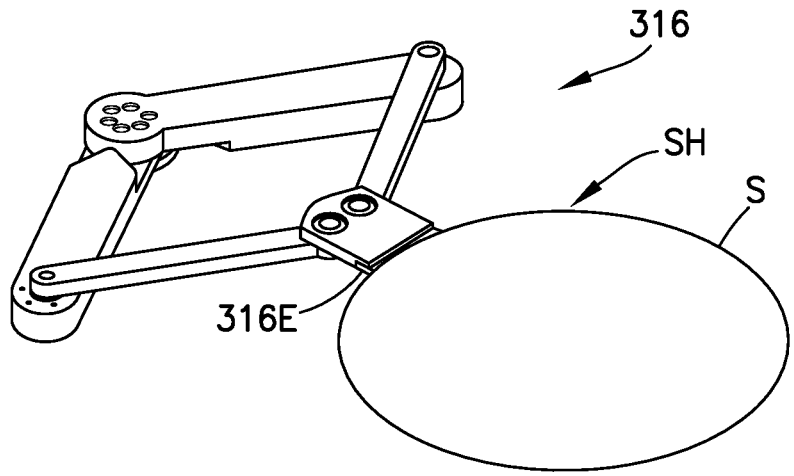
FIGS. 3A-3E are schematic illustrations of transport arms in accordance with aspects of the disclosed embodiment.
Figure 3B:
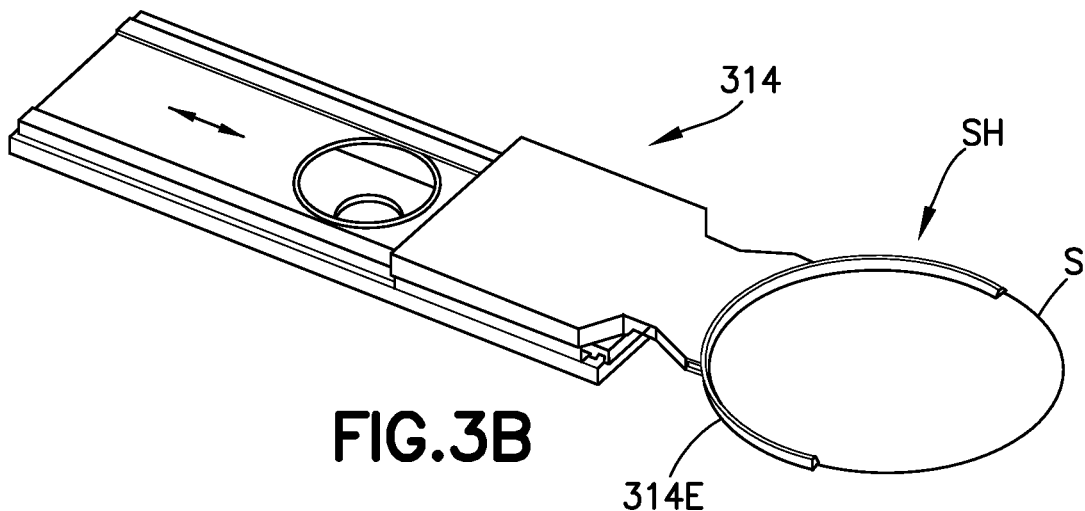
Figure 3C:
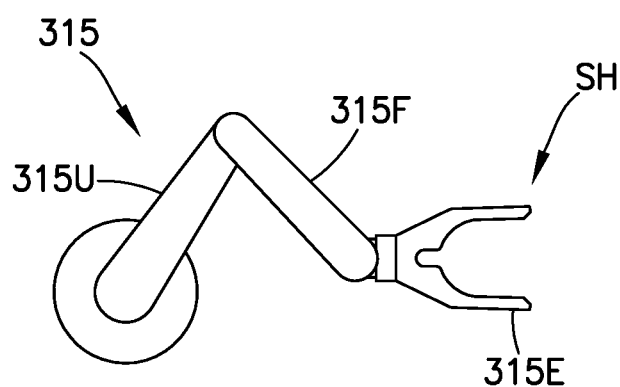
Figure 3D:
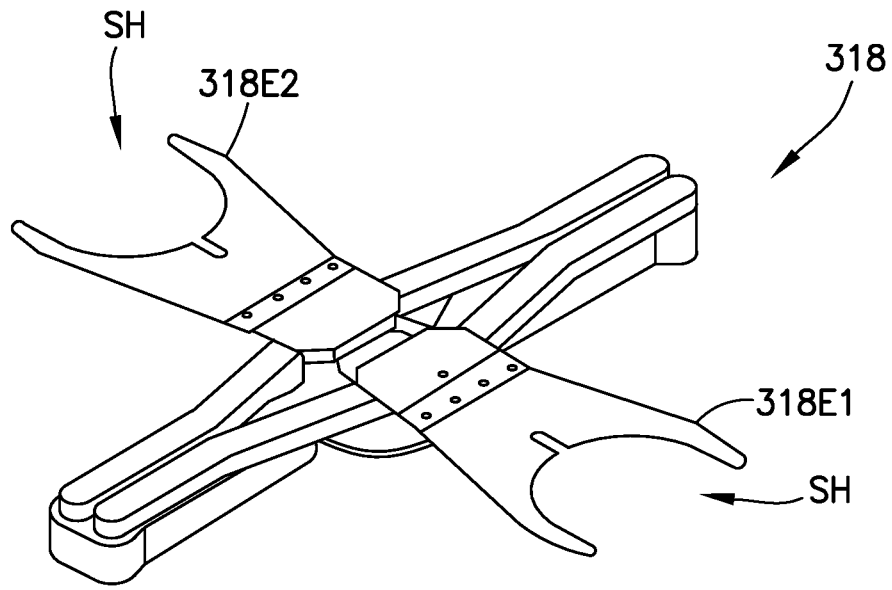
Figure 3E:
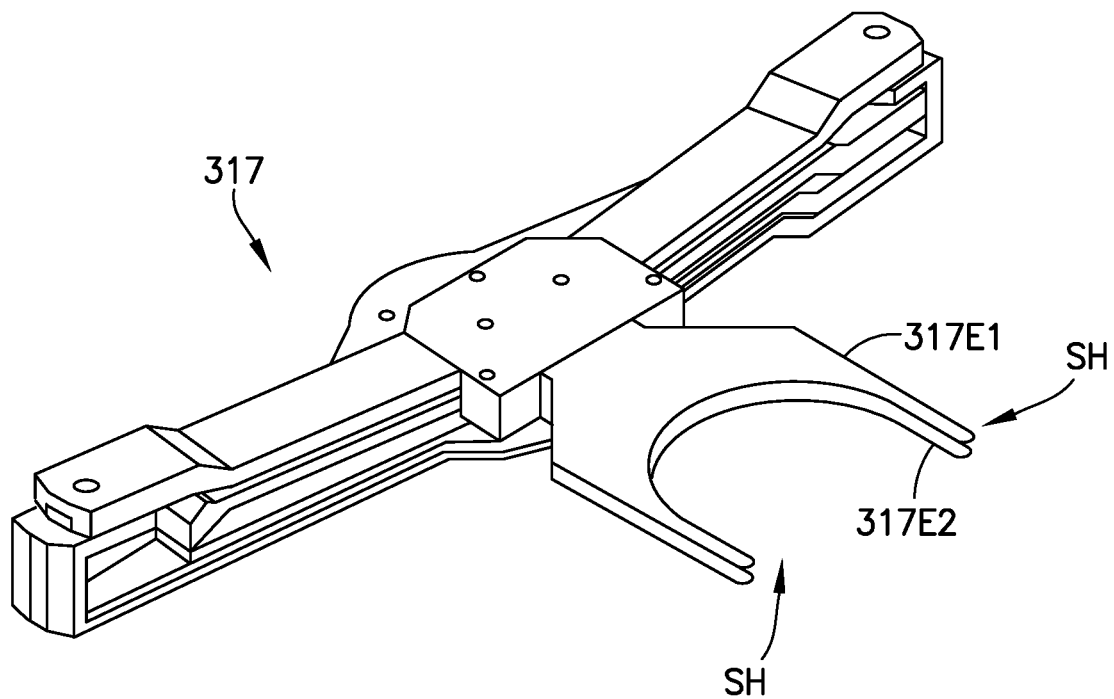

Referring now to FIGS. 3A-3E, the boom arm 143 and/or transport unit module 104 may include any suitable arm linkage mechanism(s). Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one transfer arm of each transport unit module 104, the boom arm 143 and/or the linear slide 144 may be derived from a conventional SCARA arm 315 (selective compliant articulated robot arm) (FIG. 3C) type design, which includes an upper arm 315U, a band-driven forearm 315F and a band-constrained end-effector 315E, or from a telescoping arm or any other suitable arm design, such as a Cartesian linearly sliding arm 314 (FIG. 3B). Suitable examples of transport arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on January 19, 100G, the disclosures of which are incorporated by reference herein in their entireties. The operation of the transfer arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 316 (FIG. 3A) configuration, a leap frog arm 317 (FIG. 3E) configuration, a bi-symmetric arm 318 (FIG. 3D) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties. It is noted that the boom arm 143 may have a configuration substantially similar to transport arms 314, 315, 316, 317, 318 where the transport module unit 104 is mounted to the boom arm in place of the end effector 315E, 316E, 317E1, 317E1, 318E1, 318E2. As may be realized, the transport arm(s) 314, 315, 316, 317, 318 are operably coupled to a respective drive section 200, 200A, 200B, 200C in any suitable manner so that the respective drive section 200, 200A, 200B, 200C effects articulated motion of the transport arm 314, 315, 316, 317, 318 relative to a frame, such as frame 200F or any suitable frame of the processing tool 100A-100H, between a first arm position 2030A (e.g., such as a retracted position of the transport arm—see FIG. 4A) and a second arm position 2030B (e.g., such as an extended position of the transport arm—see FIG. 4B) that is different than the first arm position 2030A, in a transport space TSP (see FIGS. 4A and 4B) defined by articulation of the transport arm 314, 315, 316, 317, 318 along at least one axis of motion relative the frame 200F. As will be described in greater detail below, any suitable controller, such as controller 110, is coupled to the drive section 200, 200A, 200B, 200C in any suitable manner to drive the drive section 200, 200A, 200B, 200C so as to effect the articulation of the transport arm 314, 315, 316, 317, 318. The controller 110 includes a droop compensator 110DC configured so that the arm droop compensator 110DC resolves an arm droop distance DRP (FIG. 4D) of the transport arm 314, 315, 316, 317, 318, due to transport arm droop, between the first arm position 2030A and the second arm position 2030B as will be described in greater detail herein.

Referring now to FIGS. 4A-4D a schematic illustration of a substrate transport arm droop mapping apparatus 2000 is illustrated. In one aspect, the mapping apparatus 2000 includes a frame 2000F that is configured to receive a transport apparatus 2004 in any suitable manner so that the transport arm 315-318 of the transport apparatus 2004 is movably positioned as described herein. In one aspect, the transport apparatus 2004 is substantially similar to for example, transport apparatus module 104 (including one or more transport arms 314, 315, 316, 317, 318 and a drive section 200, 200A-200C) or in other aspects the transport apparatus module 104 mounted on the boom arm 143 or linear slide 144, described above. In one aspect, the frame 2000F defines any suitable reference datum features that correspond to and represent suitable reference datum features of, for example, a transfer chamber of a front end module 101 or transfer chamber 125A-125F, 3018, 3018A, 416 of any suitable processing tool 100A-100H.

In one aspect, the frame 2000F includes a mounting surface 2010 that forms a datum reference surface to which a mounting flange 200F of the transport apparatus 2004 is connected. Engagement of the mounting flange 200F with the mounting surface 2010, in one aspect, establishes the vertical or Z location of the transfer plane TP. In other aspects, the mounting surface 2010 forms a datum reference surface that engages Z-axis rails 2007 of the transport apparatus 2004. Engagement of the Z-axis rails 2007 with the mounting surface 2010, in one aspect, establishes the vertical or Z location of the transfer plane TP. In one aspect, the datum reference surface formed by the mounting surface 2010 forms an interface between the frame 2000F and the transport apparatus 2004 that is representative of the substrate transport space TSP in the a processing tool (such as a front end module 101 or transfer chamber 125A-125F, 3018, 3018A, 416) defined by the substrate transport system of the processing apparatus 100A, 100B, 100C, 100D, 100E, 100F, 100G, 100H. In one aspect, the substrate transport system includes one or more of the transport apparatus 2004 of the processing tool 100A-100H, substrate holding locations (e.g. process modules, aligners, buffers, etc.), substrate/cassette elevators and slot valves SV.

In one aspect, the transport apparatus 2004 has an articulated arm 314, 315, 316, 317, 318 (such as those described above) that includes a drive section 200, 200A-200C and an end effector 314E, 315E, 316E, 317E1, 317E2, 318E1, 318E2 having a substrate holder SH. For explanatory purposes the end effector 315E and arm 315 will be used to describe aspects of the disclosed embodiment but is should be understood that the aspects of the disclosed embodiment apply equally to arms 314, 315, 316, 317, 318 and end effectors 314E, 316E, 317E1, 317E2, 318E1, 318E2. The transport apparatus 2004 may be mounted to the frame 2000F by a respective drive section 200, 200A, 200B, 200C so as to provide the transport arm 315 with at least one axis of motion (θ, R, Z) for movement in at least one degree of freedom for determining the droop distance DRP of the transport arm 315 as described herein. In one aspect, the transport apparatus 2004 is mounted to the frame 2000F so as to have a predetermined relation to at least one datum feature 2000DF of the frame 2000F. For example, in one aspect, a mounting flange 200F and/or the z-axis rails 2007 of the transport apparatus 2004 drive section 200, 200A, 200B, 200C may be arranged relative to a home or zeroed position of the transport arm 315. For example, the mounting flange 200F (or housing of the drive section 200) and/or Z-axis rails may include any suitable datum reference feature 200DF that orients the rotational position of the transport arm 315-318 in the T direction about axis θ. For example, the datum reference features 200DF may define or otherwise indicate a rotational orientation of the arm about the axis θ that corresponds with a rotational angle of extension and retraction of zero degrees (see extension axis R1 and corresponding angle θ1 in FIG. 4C). The frame 2000F of the mapping apparatus 2000 includes any suitable datum or reference feature 2000DF that is configured to interface or couple with the datum reference features 200DF of the transport apparatus 2004 so that mapping of the droop distance DRP of the transport arm 315 can be done with respect to the datum feature 200DF in a predetermined orientation that corresponds with an orientation of the transport apparatus 2004 within a processing apparatus 100A-100H. For example, the interface or coupling of the datum reference features 200DF, 2000DF rotationally positions the substrate transport 2004 within the frame 2000 in the T direction about axis θ so that the rotational angle of extension and retraction of zero degrees (e.g. extension axis R1) is in a known predetermined location relative to the frame 2000F. As may be realized, mounting the transport apparatus 2004 in the frame 2000F in a known position provides for the mapping of the droop distance DRP at substantially all angles θ1-θ8 of transport arm extension and retraction as well as for all distances DEXT (e.g. reach positions) of extension of the arm along the different axes of extension R1-R8.

In one aspect, the substrate transport arm droop mapping apparatus 2000 also includes a registration system 2020 that is disposed with respect to the substrate transport arm 315 and the at least one datum feature 200DF, 2000DF so that the registration system registers the arm droop distance DRP, due to arm droop changes, between the first arm position 2030A and the second arm position 2030B, where the end effector 315E (including substrate holder SH) is moved in the transport space TSP along at least one axis of motion (e.g. R, θ, Z). In one aspect, the registration system 2020 includes any suitable controller 2020C that includes a memory 2020CM and a processor 2020CP including any suitable non-transitory computer program code to effect the operation of the substrate transport arm droop mapping apparatus 2000 as described herein. The substrate transport arm droop mapping apparatus 2000 further includes at least one sensing device 2021 configured to sense or otherwise detect at least a position of the end effector 315E as the end effector 315E travels along one or more paths of extension and retraction R1-R8 of the substrate transport arm 315-318 within the transport space TSP. In other aspects, the at least one sensing device 2021 is configured to sense or detect a position of any suitable portion of the substrate transport arm 315 (the wrist joint corresponding to axis T3, a substrate S held on the end effector 315E, etc.). In one aspect, the at least one sensing device 2021 includes at least one optical sensor, such as motion tracking camera(s) or through beam sensors, or any other suitable sensor (such as, for example, proximity sensors, capacitive sensors, laser sensors, confocal sensors, or sensors using radar, LIDAR, or echolocation) configured to sense/detect the position of at least the end effector 315E within the transport space TSP. In one aspect, the at least one sensing device 2021 is arranged or otherwise interfaced with any suitable feature of the transport arm 315, such as the end effector 315E, the substrate S held on the end effector and/or any other suitable feature of the transport arm 315 so as to locate the feature of the transport arm 315, such as a position of the feature in the Z direction compared or relative to a predetermined reference datum that is representative of a substrate transfer plane TP.

In one aspect, the controller 2020C, may be substantially similar to controller 110 in that controller 2020 is configured to control the transport apparatus 2004 to extend along one or more paths of extension and retraction R1-R8, and with motion in any suitable number of degrees of freedom as described herein. The controller 2020C is coupled to the at least one sensing device 2021 in any suitable manner, such as through any suitable wired or wireless connection. The at least one sensing device 2021 is configured to send and the controller 2020C is configured to receive any suitable signals from the at least one sensing device 2021 that embody a position location (e.g. θ, R and Z) of the end effector 315E or any other suitable feature of the substrate transport arm 315-318 (including a substrate S held thereon) within the transport space TSP with respect to the transport plane TP. For example, referring also to FIGS. 4A-4D and 5, a schematic illustration of a droop distance DRP is illustrated for a substrate transport arm such as substrate transport arm 315. In this aspect, the droop distance DRP is shown as being measured at three points along the substrate S carried on the end effector 315E of the substrate transport arm 315. For example, the droop distance DRP (e.g. the change in Z position of the end effector 315E and substrate held thereon) relative to the transfer plane TP may be measured at a leading edge SLT of the substrate S, a center SC of the substrate S and/or a trailing edge SLT of the substrate S as the substrate S is transported along an axis of extension and retraction R1-R8. As described herein, the transfer plane TP may be defined based a position of the substrate S or end effector 315E when the transport arm 315 is in a retracted configuration, such as when the substrate S is in the first position 2030A (e.g. such as at the center SC of the substrate S with the arm in the retracted configuration). In other aspects, the transfer plane TP may be defined based on a position of any suitable substrate holding station (e.g. of process modules, buffers, aligners, load locks, etc.). As also described herein, the non-linear factors of the transport arm 315 render the change in the Z position (e.g. the droop distance DRP) relative to, for example, any suitable reference datum such as the transport plane TP, highly dependent on the specific configuration of the transport arm 315, and the droop DRP varies uniquely with each arm 314, 315, 316, 317, 318.

Figure 4C:
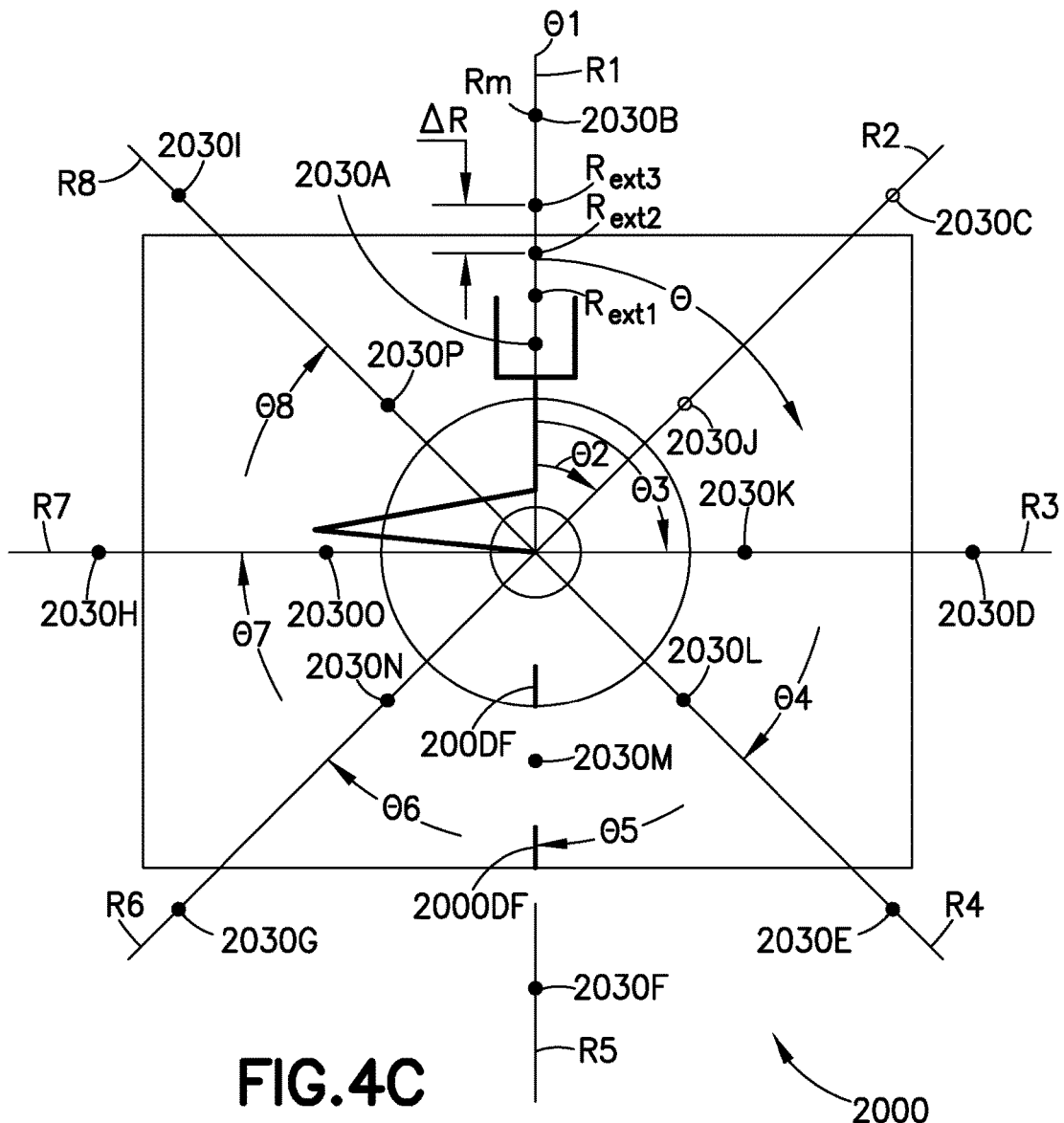
Figure 4D:
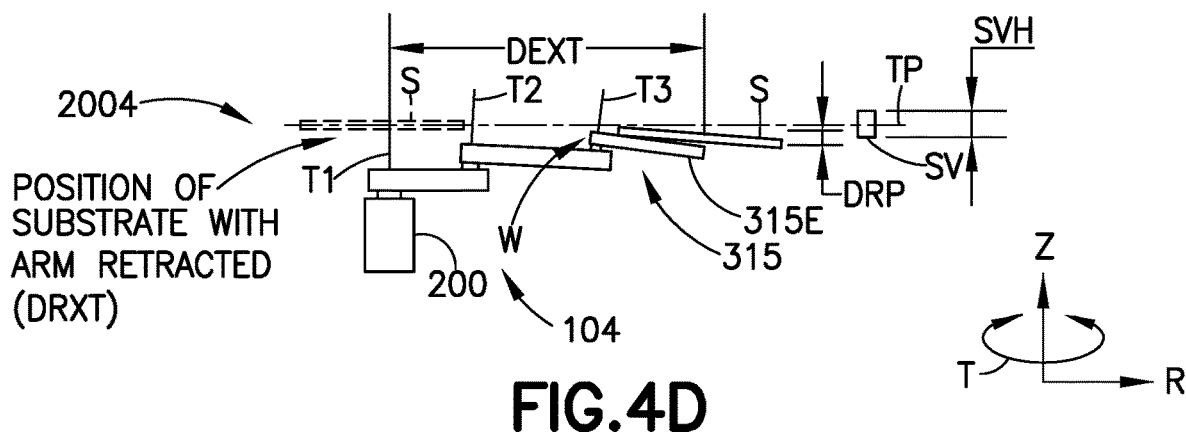
FIG. 4D is a schematic illustration of a substrate transport arm exhibiting arm droop in accordance with aspects of the disclosed embodiment.

Still referring to FIGS. 4A-4D and 5, an exemplary operation of the substrate transport arm droop mapping apparatus 2000 will be described. In one aspect, the frame 2000F is provided (FIG. 6, Block 600) at any suitable location, such as on a semiconductor production facility factory floor or at a manufacturing facility of the substrate transport 104 and/or transfer arm 315. As described above, the frame includes an interface, e.g. such as the reference datum features 2000DF described above, on the frame where the reference datum features 2000F are representative of the substrate transport space TSP. The substrate transport arm 315 is mounted to the frame 2000F (FIG. 6, Block 610) in any suitable manner, such as that described above, in a predetermined relation to at least one of the datum features 2000DF. In one aspect, the drive section 200, 200A-200C is mounted to the frame 2000F and the transport arm 315 is mounted to the drive section 200, 200A-200C so that the drive section 200, 200A-200C effects extension of the transport arm 315 relative to the at least one datum feature 2000DF. As can be seen in FIG. 4C, the drive section 200, 200A-200C and the transport arm 315 mounted thereto are mounted to the frame 2000F so that the reference datum feature 200F of the transport apparatus 2004 is located in a predetermined orientation (e.g. aligned in any suitable manner) relative to the reference datum feature 2000DF of the frame 2000F. Here the alignment of the reference datum features 200DF, 2000DF orients the zeroed or home position of the transport arm 315 at an angle which corresponds to axis of extension and retraction R1. The angle θ1 and axis of extension and retraction R1, in one aspect, corresponds with the home or zeroed position of the transport apparatus 2004 when the transport apparatus 2004 is located within a transfer chamber (such as a front end module 101 or transfer chamber 125A-125F, 3018, 3018A, 416) of any suitable processing apparatus 100A-H. In one aspect, the angle θ1 and axis of extension and retraction R1, and each other angle θ2-θ8 and axis of extension and retraction R2-R8, may correspond with a respective axis of extension and retraction of the transfer chamber 125A-125F, 3018, 3018A, 416 in which the transport apparatus 104 or transport arm 315 will be mounted.

In one aspect, the transport arm 315 mounted to the drive section 200, 200A-200C may be selectable from a number of transport arms 315-318 that are mounted to a common drive section 200, 200A-200C. For example, drive section 200 may be mounted to the frame 2000F as described above. Arms 314, 315, 316, 317, 318 may be interchangeable with each other so that any one of the arms 314, 315, 316, 317, 318 may be selected and mounted to the drive section 200. Here a transport arm 315 is selected from the number of interchangeable transport arms 314, 315, 316, 317, 318 for mounting to the drive section 200 within the frame 2000F.

As described above, the controller 2020C is configured to effect movement of the transport arm 315. The controller 2020C effects movement of the transport arm 315 along at least one axis of motion in the transport space TSP (FIG. 6, Block 620) between the first arm position 2030A and the second arm position 2030B. As described herein the first arm position 2030A may be the retracted position of the transport arm 315 and the second arm position 2030B may be a position of a slot valve SV or a substrate holding position of any suitable substrate holding station (e.g. load locks, buffers, process modules, etc.) of any suitable substrate processing apparatus 100A-100H. For exemplary purposes only, the transport arm is extended along axis of extension and retraction R1 at angle θ1. The arm droop distance DRP of the transport arm 315 is registered (FIG. 6, Block 630) with the registration system 2020 in any suitable manner. For example, in one aspect, the droop distance DRP may be measured from the transfer plane TP which may be established from the retracted home/zeroed position of the substrate S (e.g. when the transport arm is retracted along axis of extension and retraction R1 to the first position 2030A at angle θ1). The transfer plane TP may define a reference datum from which the droop distance DRP is measured for all angles θ1-θ8 and all axes of extension and retraction R1-R8. Here there are eight axes of extension and retraction R1-R8 and eight corresponding angles θ1-θ8 but in other aspects, there may be more or less than eight axes of extension and retraction and more or less than eight corresponding angles.

Figure 5:
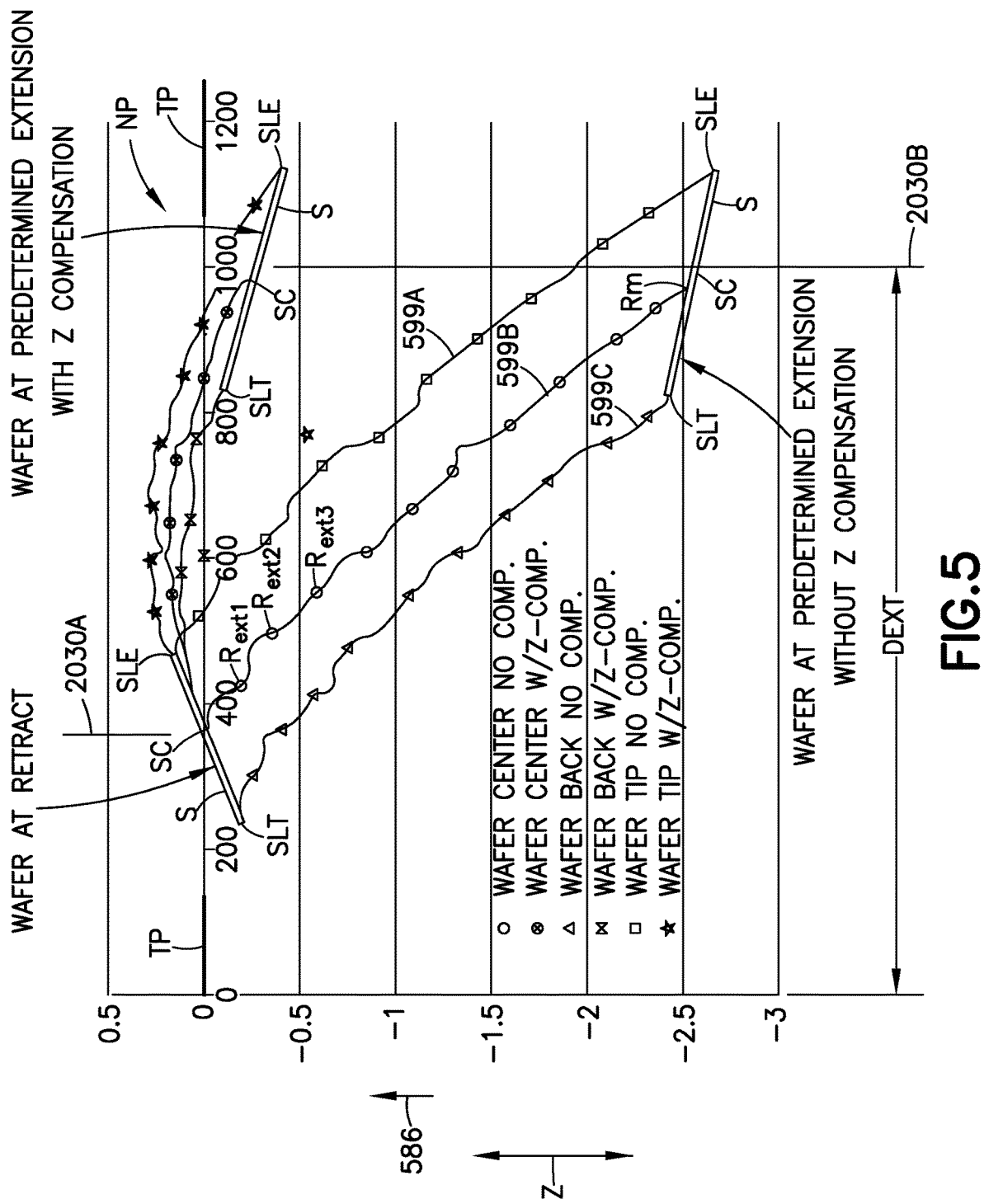
FIG. 5 is an exemplary graphical illustration of substrate position in accordance with aspects of the disclosed embodiment.

As can be seen in FIG. 5, the transport plane TP may correspond with a center SC of the substrate S held on the end effector 315E of the transport arm 315. The registration system 2020 is configured to detect, for example, the Z position of the substrate at any suitable points (such as the leading edge SLE, the center SC and/or the trailing edge SLT of the substrate S) on the substrate S. Here the Z position of the substrate is used as a matter of convenience and in other aspects, the droop distance DRP of the transport arm 315 may be along any suitable axis of any suitable reference frame. In FIG. 5 the uncompensated Z positions of the leading edge SLE, the center SC and the trailing edge SLT of the substrate S are mapped relative to arm extension DEXT as the transport arm 315 is extended along, for example, axis R1 from the first position 2030A to the second position 2030B. As can be seen in FIG. 5, at position 2030A the trailing edge SLT of the substrate S is lower than the leading edge of the substrate SLE whereas at the second position 2030B the trailing edge of the substrate SLT is higher than the leading edge of the substrate SLE. As can also be seen in FIG. 5 due to the linear and non-linear factors effecting extension of the transport arm 315, the uncompensated Z position of the center SC of the substrate S is about 2.5 distance units lower than the transfer plane TP.

In one aspect, the registration system 2020 is configured to sample the Z position of the substrate at any suitable incremental distance along the axis of extension and retraction R1. For example, the Z position of the substrate may be sampled or measured every ΔR distance unit increments as the end effector 315E travels along the axis of extension and retraction R1. In one aspect, the droop distance DRP is illustrated in FIG. 5 as being substantially linear (varying with the distance along the axis of extension and retraction R1) for exemplary purposes only, but it should be understood that the droop distance may not vary linearly such as where gross non-linear variations are apparent. In instances where the droop distance is not linear the Z position of the substrate may be measured at more frequently (e.g. at smaller ΔR distance unit increments between sampling) as the substrate S moves along the axis of extension and retraction R1 to increase the definition of the substrate Z position or droop distance DRP mapping along the axis of extension and retraction R1.

Figure 7:
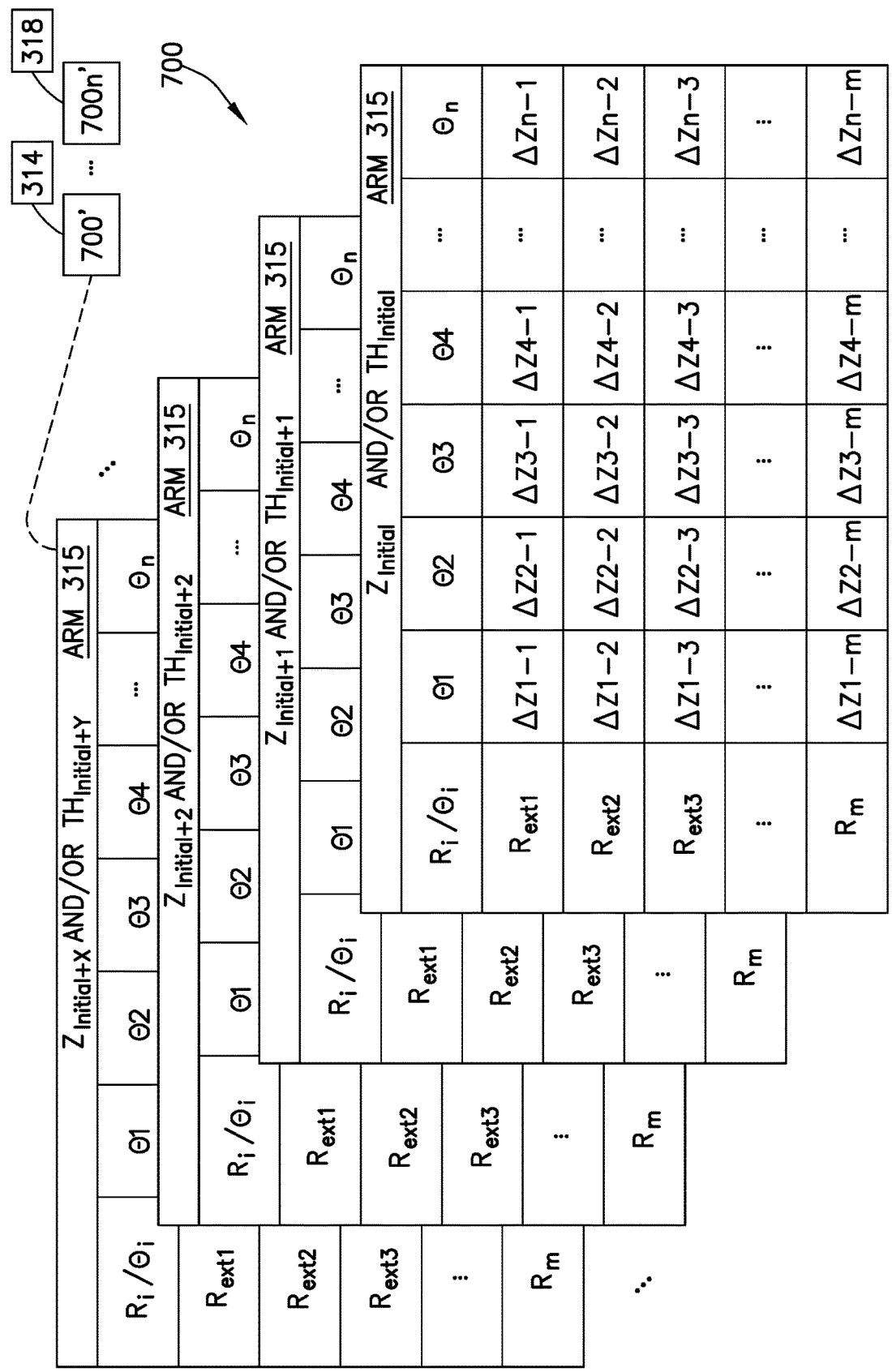
FIG. 7 is a schematic illustration of a droop registration in accordance with aspects of the disclosed embodiment.

The measurements of the droop distance DRP taken as the substrate S moves along the axis of extension and retraction R1 at the different ΔR distance unit intervals between the first position 2030A and the second position 2030B are recorded in, for example, the memory 2020CM of the controller 2020C or any other suitable memory. In one aspect, the droop distance DRP measurements are stored in any suitable format/manner that is suitable for programmed control of the transport apparatus 2004 including the transport arm 315, such as in the form of a look up table or any suitable algorithm. In one aspect the droop distance DRP measurements may be stored in an arm droop distance register 700 that has the form of a look up table, an example of which is illustrated in FIG. 7. In one aspect, the arm droop distance register 700 includes an extension position $R_{ext1-m}$ of the transport arm 315 at, for example, the center SC of the substrate S carried on the end effector 315E (in other aspects, the extension position of the transport arm 315 may be determined from any suitable feature of the transport arm 315 or substrate S) plotted against the extension angle $\theta_{1-n}$ of the transport arm 315. In one aspect, $R_{ext1}$ corresponds to the retracted position of the transport at the respective angle $\theta_{1-n}$ while $R_m$ corresponds to the position of the transport arm 315 at the second position 2030B (or subsequent position different from the retracted position of the arm). Here each extension position $R_{ext1}$-$R_m$ (there may be any suitable number of extension positions) corresponds to the sampling locations of the droop measurement DRP. In one aspect, the ΔR distance unit increment (FIG. 4C) between the extension positions $R_{ext1}$-$R_m$ may be substantially constant while in other aspects, the ΔR distance unit increment may be variable to, for example, provide greater definition in predetermined areas of the droop mapping (e.g. along predetermined areas of the axis of extension and retraction R1-R8). In one aspect, the angles $\theta_{1-n}$ correspond to axes of extension and retraction R1-R8 to different substrate holding locations; however, in other aspects, there may be any suitable number of angles along which the droop DRP is measured.

Figure 6:
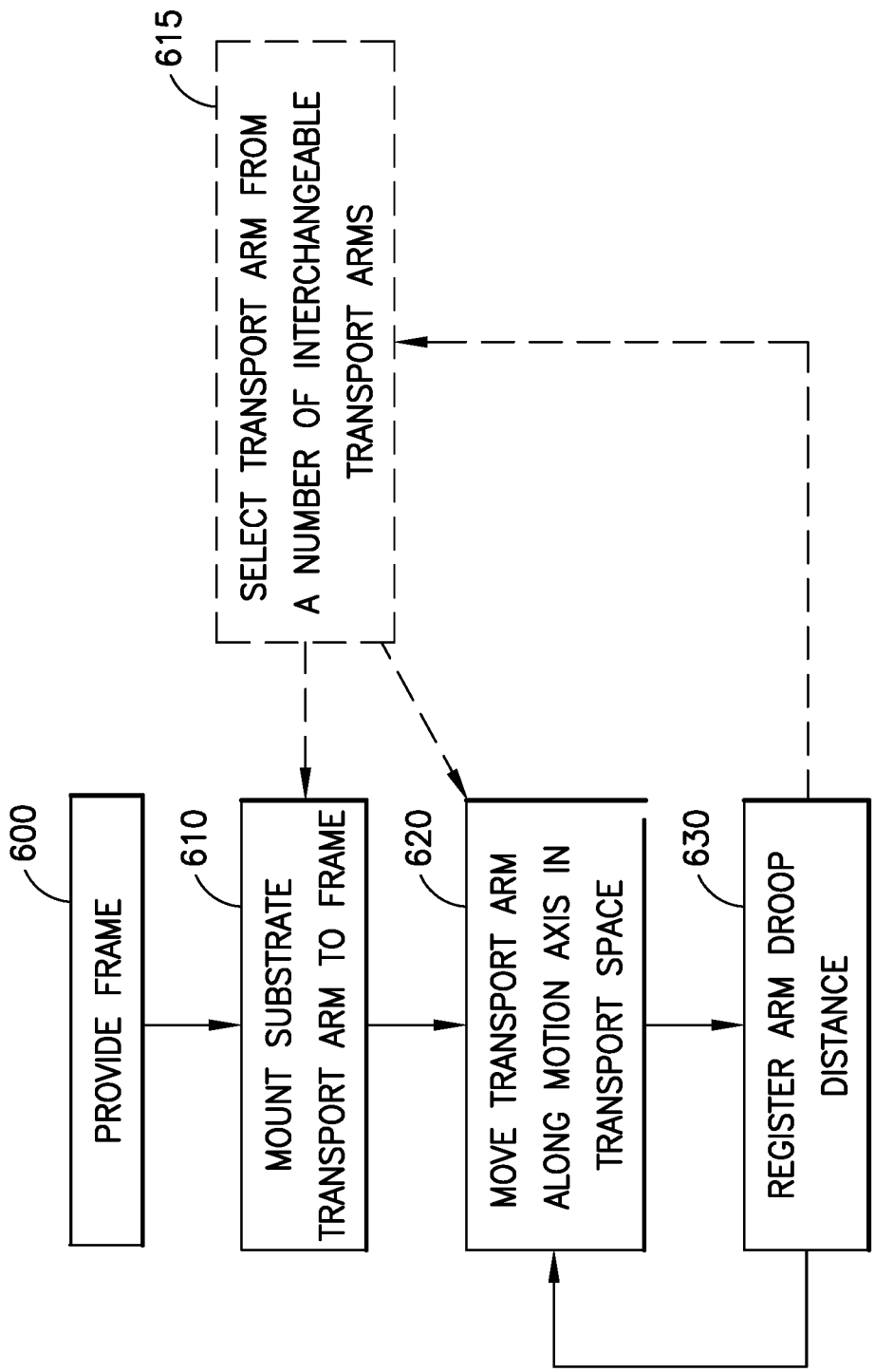
FIG. 6 is an exemplary flow diagram in accordance with aspects of the disclosed embodiment.

In one aspect, the controller 2020C is configured to extend the transport arm 315 along axis of extension and retraction R1 at angle θ1 by driving the drive section 200 in any suitable manner. As the transport arm 315 extends the sensing devices 2021 measure the Z position ΔZ1-1 to ΔZ1-$m$ of, for example, the substrate S at the extension positions $R_{ext1}$-$R_m$. The arm droop DRP distances ΔZ1-1 to ΔZ1-$m$ are registered (FIG. 6, Block 630) in the controller in any suitable manner, such as in the arm droop distance register 700. The controller 2020C is further configured to rotate the transport arm 315 so that the end effector 315E is positioned to extend along another axis of extension and retraction R2 at angle θ2 where Blocks 620 and 630 of FIG. 6 are repeated to obtain droop DRP distances ΔZ2-1 to ΔZ2-$m$ for registration in the arm droop distance register 700. Droop distance measurements are taken at each angle $\theta_{1-n}$ and for every extension position $R_{ext1-m}$, in the manner described above, so that the corresponding droop DRP is measured and is represented in the arm droop distance register 700, e.g., as ΔZ1-1 to ΔZ1-$m$ for angle θ1 to ΔZn-1 to ΔZn-m for angle θn. Here the arm droop distance register 700 describes the arm droop distance DRP at the first arm position 2030A, the second arm position 2030B and at a third arm position 2030C (and subsequent arm positions 2030D-2030P), where the third arm position 2030C (and subsequent arm positions 2030D-2030P) are different from both the first arm position 2030A and the second arm position 2030B, where the end effector 315E is moved along at least one axis of motion (in this example, the extension axis R of motion, but in other aspects in the T direction along the θ axis of motion and/or along the Z axis of motion). It is noted that the arm droop distance register 700 is illustrated with a single droop distance measurement (ΔZ1-1 to ΔZ1-$m$ for angle θ1 to ΔZn-1 to ΔZn-m for angle θn) which may correspond to the center SC of the substrate S, but it should be understood that in other aspects, arm droop distance register 700 may also include droop distance measurements for the leading edge SLE and/or the trailing edge SLT of the substrate S.

As can be seen in FIG. 7, the arm droop distance register 700 may not only be a two-dimensional array correlating the droop distance DRP with an extension distance $R_{ext1}$-$R_m$ but can also be configured so as to compensate for different environmental conditions (e.g. such as different operating temperatures TH) in which the transport apparatus 104 operates and/or to compensate for extension of the arm at different heights of the transport arm 315 along the Z axis. For example, blocks 620 and 630 of FIG. 6 may be repeated for any suitable number of different temperatures $TH_{initial}$-$TH_{initial/}$, so that the droop compensation described by the arm droop distance register 700 and the arm droop compensation (described herein) effected thereby accommodates for, e.g., thermal expansion and contraction of the arm components (e.g. arm links, pulleys, belts, end effector, etc.). Blocks 620 and 630 of FIG. 6 may also be repeated for any suitable number of different Z heights $Z_{initial}$-$Z_{initial+x}$ so that the arm droop distance register 700 and the droop compensation effected thereby (described herein) accommodates for, e.g., misalignment between the Z axis of the transport apparatus 104 and the coaxial spindle of the drive section 200 and/or for misalignment between the drive shafts of the coaxial drive section 200, 200A-200C to which the transport arm 315 is coupled. In still further aspects, where the transport apparatus 104 includes interchangeable arms 314, 315, 316, 317, 318 an arm droop distance register 700, 700'-700n' may be created for each of the interchangeable arms 314, 315, 316, 317, 318 in the manner described above.

As may be realized, arm droop distance registers may be created in a manner similar to that above with respect to aspects where the transport arm 2004 is mounted to the boom arm 143 or linear slide 144. Here the boom arm 143 or linear slide 144, with the transport arm 2004 mounted thereto, may be mounted to the frame 2000F of the substrate transport arm droop mapping apparatus 2000 in a manner substantially similar to that described above, where the registration system 2020 determines the droop distance of the transport arm 2004 mounted to the boom arm 143 or linear slide 144 in a manner similar to that described above with respect to the axes of extension and retraction R such as shown in FIGS. 1C and 1D so that the droop distance DRP effected by both the transport arm 2004 and the boom arm 143 or linear slide 144 is registered in a corresponding arm droop register 700.

As can be seen in FIG. 7, the arm droop distance register 700 is embodied so as (e.g. has a form) to define a curve, such as curves 599A-C, describing arm droop distance DRP variation relative to arm positions $R_{ext1}$-$R_m$, θ1-θn where the end effector 315E is moved along one or more axis (axes) of motion R, θ, Z. In one aspect, the one or more axis (axes) of motion R, θ, Z define a transfer plane TP or a transfer volume TSV in the substrate transport space TSP. As can be seen in FIG. 7, each curve 599A-C describes discrete arm droop distance variation relative to arm positions (see extension distances $R_{ext1}$-$R_m$) for end effector 315E motion along each of the one or more axes of motion R, θ, Z.

In one aspect, still referring to FIGS. 4A-4D, 5 and 7, as well as FIGS. 1A-1M and 2A-2D, the arm droop distance register(s) 700 travel with the respective transport apparatus 2004 (and the different selectable arms 314, 315, 316, 317, 318 if so equipped). In one aspect, the arm droop distance register(s) 700 for the transport apparatus 2004 is/are transferred (e.g. loaded into in any suitable manner) to a droop compensator 110DC of the controller 110 for the processing apparatus 100A-100H in which the transport apparatus 2004 is to be used. In one aspect, the droop compensator 110DC may be disposed within the housing of the drive section 200, 200A-200C and coupled to the controller 110 in any suitable manner for effecting arm droop compensation as described herein. The controller 110 is then configured to effect, with the drive section 200, 200A-200C of the transport apparatus 2004, a compensating motion of the transport arm 2004, such as transport arm 315, where the compensating motion has a magnitude and direction compensating for and resolving the droop distance DRP of the transport arm 315 substantially in its entirety. In one aspect, using processing apparatus 100A of FIG. 1A as an example, the droop compensator 110DC of controller 110 is configured in any suitable manner to determine the droop distance DRP of the transport arm 315, from the droop distance register(s) 700, between the first position 2030A and the second position 2030B, the second position 2030B in this example, being a location of slot valve SV. In one aspect, the magnitude and direction of the compensating motion is determined from the droop distance register(s) 700.

As illustrated in FIG. 5, the controller 110 drives, for example, the Z axis drive of the drive section 200, 200A-200C of the transport apparatus 2004 (illustrated as transport apparatus 104 in FIG. 1A) in accordance with the magnitude and direction of the compensating motion determined from the droop distance register(s) 700 so that the substrate S travels substantially along the transfer plane TP throughout end effector 315E movement along the axis of extension and retraction, such as axis R1. In this aspect, the compensating motion is in direction 586 and has a magnitude corresponding substantially to the amount of uncompensated droop (e.g. the droop distance DRP) illustrated in FIGS. 4D and 5. As such, the compensating motion of the transport arm 315 results in cancellation of the droop distance DRP of the transport arm 315, with respect to the transfer plane TP (e.g. where the transfer plane TP forms a predetermined reference datum for transferring the substrate S), substantially in its entirety so that the end effector 315E at the second position 2030A in the transport space TSP is at a net position NP (e.g. along the transfer plane TP with substantially no deviation above or below the transfer plane TP), in the direction in which the arm droop is manifested (here the Z direction), that is independent of the arm droop. Again, it is noted that while the second position 2030B is illustrated as a slot valve SV location, in other aspects the second position 2030B may be any suitable predetermined substrate destination location (e.g. holding location of an aligner, buffer, processing module, etc.) in the processing apparatus 100A-100H.

Figure 9:
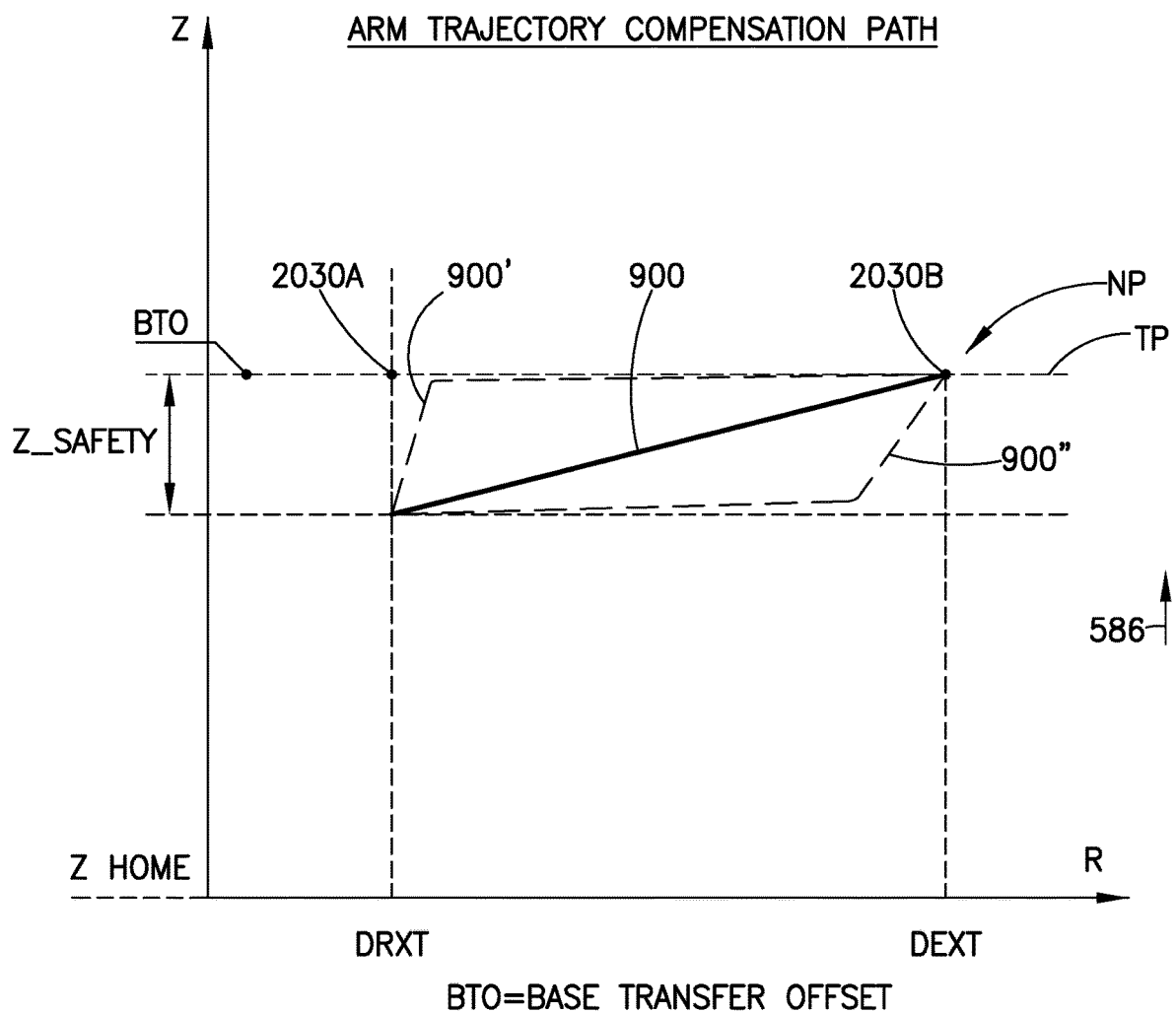
FIG. 9 is an exemplary graphical illustration of transport arm position compensation in accordance with aspects of the disclosed embodiment.

Referring to FIG. 9, the controller 110 is configured to effect the compensating motion of the transport arm 315 so that the end effector 315E completes motion reaching the second position 2030B at the net position NP. As can be seen in FIG. 9, the end effector is located at the retracted position DRXT which may correspond to the first position 2030A. The controller 110 controls, for example, motion 900 of the transport arm 315 (which in this example is a Z axis motion in direction 586) so that the end effector 315E completes motion reaching the second position 2030B at the net position NP along the transfer plane TP. As may be realized, arriving at the net position NP places, for example, the center SC of the substrate S (or any other suitable feature of the transport arm 315, such as the bottom of the end effector or wrist joint coupling the end effector to the links of the transport arm) at a desired position substantially independent of the arm droop which increases processing through- put by decreasing transfer times (e.g. pick and place times) and processing times (e.g. less time to close slot valves, etc.) as described above. The positioning of the transport arm 315 substantially independent of arm droop, as described herein, also provides for locating substrate holding station end effector interface locations (e.g. handoff/transfer locations between the end effector 315 and the substrate holding location of the substrate holding station) at a predetermined location within the transport space TSP, so that positioning of the substrate holding station end effector interface locations (e.g. corresponding to the second position 2030B) is effected substantially independent of arm droop. In effect, the aspects of the disclosed embodiment provide for a substrate processing tool 100A-100H having a predetermined structure that interacts with the transport arm 315, end effector 315E and is disposed so that the interaction is effected independent of arm droop.

While the motion 900 is illustrated as a substantially linear motion, in other aspects the motion may have any suitable motion profile. For example, motion 900' increases the Z position of the end effector 315E largely towards the beginning of the motion 900' while motion 900" increases the Z position of the end effector 315E largely towards the end of the motion 900'. In one aspect, the controller 110 is configured to effect the compensation motion with the arm motion moving the end effector 315 between the first position 2030A and the second position 2030B along an optimal path with a time optimal trajectory as described in, for example, U.S. Pat. No. 9,517,558 issued on Dec. 13, 2016, U.S. Pat. No. 6,216,058 issued on Apr. 10, 2001 and U.S. Pat. No. 6,643,563 issued on Nov. 4, 2003, the disclosures of which are incorporated herein by reference in their entireties.

As described herein, the drive section 200, 200A-200C and the transport arm 315 (as well as arms 314, 316-318) are configured with multiple degrees of freedom (e.g. Z axis motion, multiple drive shafts each having a respective degree of freedom, etc.) so that motion of the transport arm, such as transport arm 315 has more than one degree of freedom. The arm droop register 700, as described above, in one aspect describes the arm droop distance DRP throughout the transport space TSP formed by the more than one degree of freedom of the arm motion of the transport arm 315. For example, as described above, in one aspect, the arm droop register 700 includes arm droop distances DRP for each rotation angle θ of the transport arm 315 and for each Z axis height of the transport arm 315 so as to define the transport space TSP.

Figure 8:
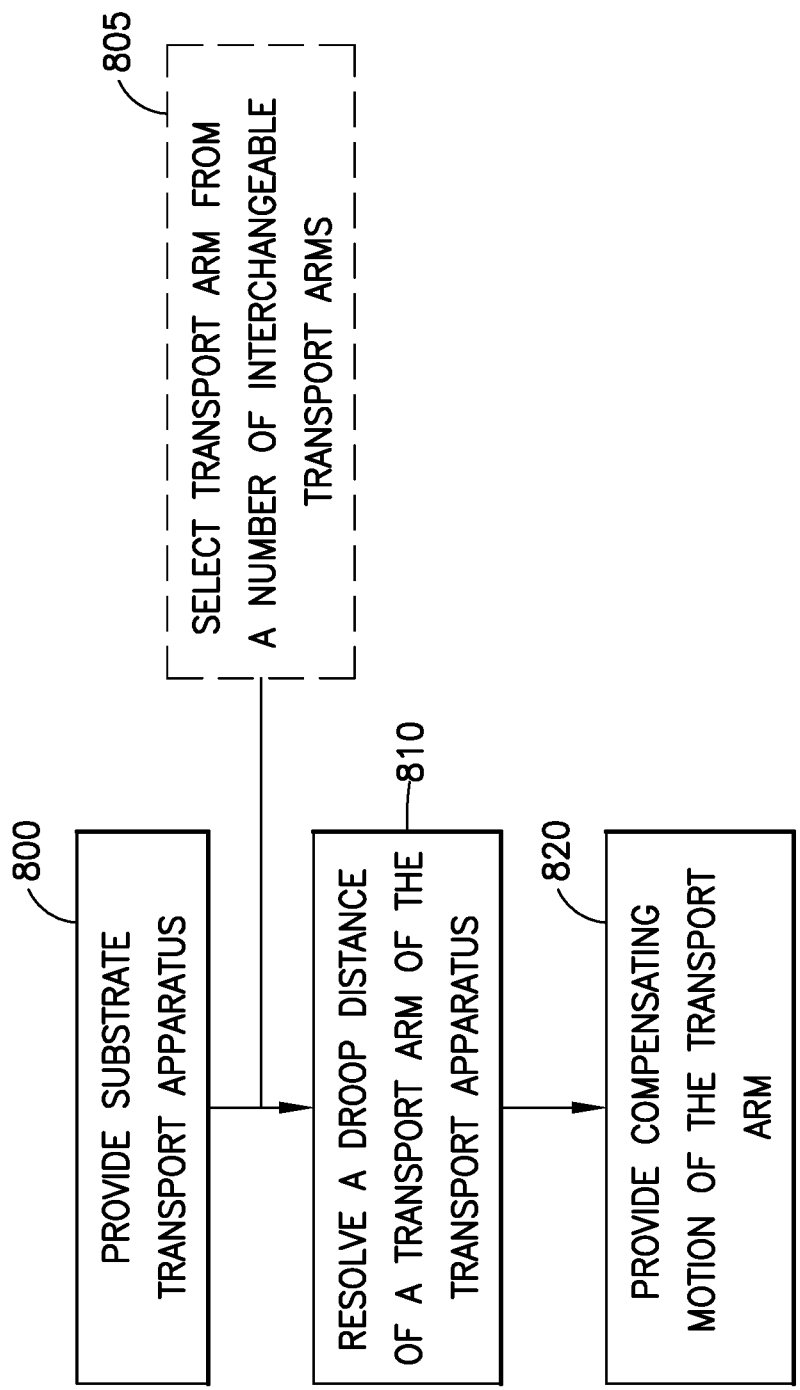
FIG. 8 is an exemplary flow diagram in accordance with aspects of the disclosed embodiment.

Referring also to FIG. 8 an exemplary operation of the transport apparatus 2004 (corresponding to transport apparatus module 104 and/or transport apparatus module 104 mounted to the boom arm 143 or linear slide 144) will be described. In one aspect, the substrate transport apparatus 2004 is provided (FIG. 8, Block 800). The substrate transport apparatus 2004 includes a drive section 200, 200A-200C that is connected to a frame of a substrate processing apparatus 100A-100H and a transport arm 314, 315, 316, 317, 318. As described above, the transport arm 314, 315, 316, 317, 318 is articulated and has an end effector 314E, 315E, 316E, 317E1, 317E2, 318E1, 318E2 with a substrate holder SH on which a substrate S is carried. The end effector 314E, 315E, 316E, 317E1, 317E2, 318E1, 318E2, as described above, is movable between a first position 2030A and a second position 2030B, that is different from the first position 2030A, in a transport space TSP defined by the articulation of the transport arm 314, 315, 316, 317, 318 along at least one axis of motion R relative to the frame. In one aspect, where the transport apparatus 2004 includes a number of selectable transport arms 314, 315, 316, 317, 318, one transport arm 314, 315, 316, 317, 318 is selected from the number of selectable transport arms 314, 315, 316, 317, 318 (FIG. 8, Block 805) for coupling with the drive section 200, 200A-200C.

The droop distance DRP of the transport arm 314, 315, 316, 317, 318 between the first position 2030A and the second position 2030B is resolved (FIG. 8, Block 810), where the droop distance DRP of the transport arm 314, 315, 316, 317, 318 between the first position 2030A and the second position 2030B is determined by, for example, the droop compensator 110DC from the arm droop register 700 corresponding to the transport apparatus 2004 configuration (e.g. the drive section and the arm selected for coupling with the drive section, which may include boom arm 143 or linear slide 144). As described above, the arm droop compensator 10DC may reside in the controller 110 of the processing apparatus 100A-100H or be resident within the drive section 200, 200A-200C and be connected to the controller 110 in any suitable manner so as to effect articulation of the transport arm.

In one aspect, the controller effects, with the drive section 200, 200A-200C a compensating motion 900, 900', 900" (see e.g. FIGS. 5 and 9) (FIG. 8, Block 820) of the transport arm 2004 between the first position 2030A and the second position 2030B that has a magnitude and a direction 586 compensating for and resolving the droop distance DRP of the transport arm 2004 substantially in its entirety. As described above, the compensating motion 900, 900', 900" of the transport arm 314, 315, 316, 317, 318 results in cancellation of the droop distance DRP with respect to any suitable predetermined reference datum, such as the transfer plane TP, substantially in its entirety so that the substrate holder SH at a predetermined location (such as the second position 2030B) in the transport space TSP is at the net position NP, in the direction (e.g. the Z direction) in which the arm droop is manifested, independent of the arm droop. In one aspect, the controller 110 completes the arm motion of the transport arm 314, 315, 316, 317, 318 between the first position 2030A and the second position 2030B so that the substrate holder SH of the end effector 314E, 315E, 316E, 317E1, 317E2, 318E1, 318E2 completes motion reaching the second position 2030B substantially at the net position NP. In one aspect the controller 110 effects the compensation motion 900, 900', 900" with arm motion moving the substrate holder SH of the end effector 314E, 315E, 316E, 317E1, 317E2, 318E1, 318E2 between the first position 2030A and the second position 2030B along an optimal path with a time optimum trajectory, as described above.

In accordance with the above-description the aspects of the disclosed embodiment provide a transport apparatus 104, 2004 having transport arms 314, 315, 316, 317, 318 that are truly swappable/interchangeable with each other on a common drive section 200, 200A-200C provided that the corresponding arm droop registers 700 for the interchangeable arms 314, 315, 316, 317, 318 are loaded into the controller 110 controlling movement of the transport apparatus 104, 2004. Further, while aspects of the disclosed embodiment are described above, it should be understood that the aspects of the disclosed embodiment can be employed to maintain any given point on the robot arm (e.g. substrate holding location on the end effector, the wrist joint, the elbow joint, etc.) within a tighter predetermined motion path tolerance compared to a resultant motion path without position compensation as described herein. For example, the aspects of the disclosed embodiment may be based on a generic three-dimensional path in the transport space TSP where that generic three-dimensional path is determined as described above using the substrate transport arm droop mapping apparatus where that generic three-dimensional path is incorporated as part of the command logic of the transport arm provided by the controller, such as controller 110. The aspects of the disclosed embodiment utilize the degrees of freedom available from the robot control system, such as the drive section 200, 200A-200C. For example, if the transport arm allows for motion along a radial, tangential, vertical and end effector orientations (such as when the transport arm is mounted to or includes a boom arm or linear slide), then all of these degrees of freedom may be used to compensate for a mechanical error trajectory in the transport space TSP.

More generally, the system and process previously described for trajectory compensation based on empiric factors for arm droop (AZ) in the 4-dimensional axes (R, θ, Z, TH) of the transport space TSP, may be similarly applied for trajectory compensation for any given point (e.g., rotation axis T1, rotation axis T2, rotation axis T3, or center SC at the first arm position 2030A or any other arm position) of the transport arm 315 at any (and every) desired point of a given trajectory in the transport space TSP. The approach shall be applicable to maintain any given point at the transport arm 315 within any desired (e.g. tighter) motion path tolerances than the resultant uncompensated mechanical path. This means that the proposed compensation approach can based on empirics be based on a generic 3-dimensional path (R, θ, Z) in space which can be predetermined via experimental measurements and incorporated as part of the algorithm inputs. The compensation algorithm shall utilize the degrees of freedom (3, 4, 5, 6, or more) available from the robot controls system. For example, if the manipulator allows for motion along a radial, tangential, vertical, and end-effector orientation directions, then all these degree of freedoms can be used to correct a mechanical trajectory error in the transport space TSP. Accordingly, the term arm droop (though used for convenience in the prior specific description to refer to uncommanded displacement in the Z direction, or "sag"), the term as used more generally herein is understood to mean uncommanded displacement of the transport arm 315 from flexing in a corresponding axis of motion or degree of freedom, such as (X, Y) droop (or in polar transformation (R, θ) droop).

Figure 7A:
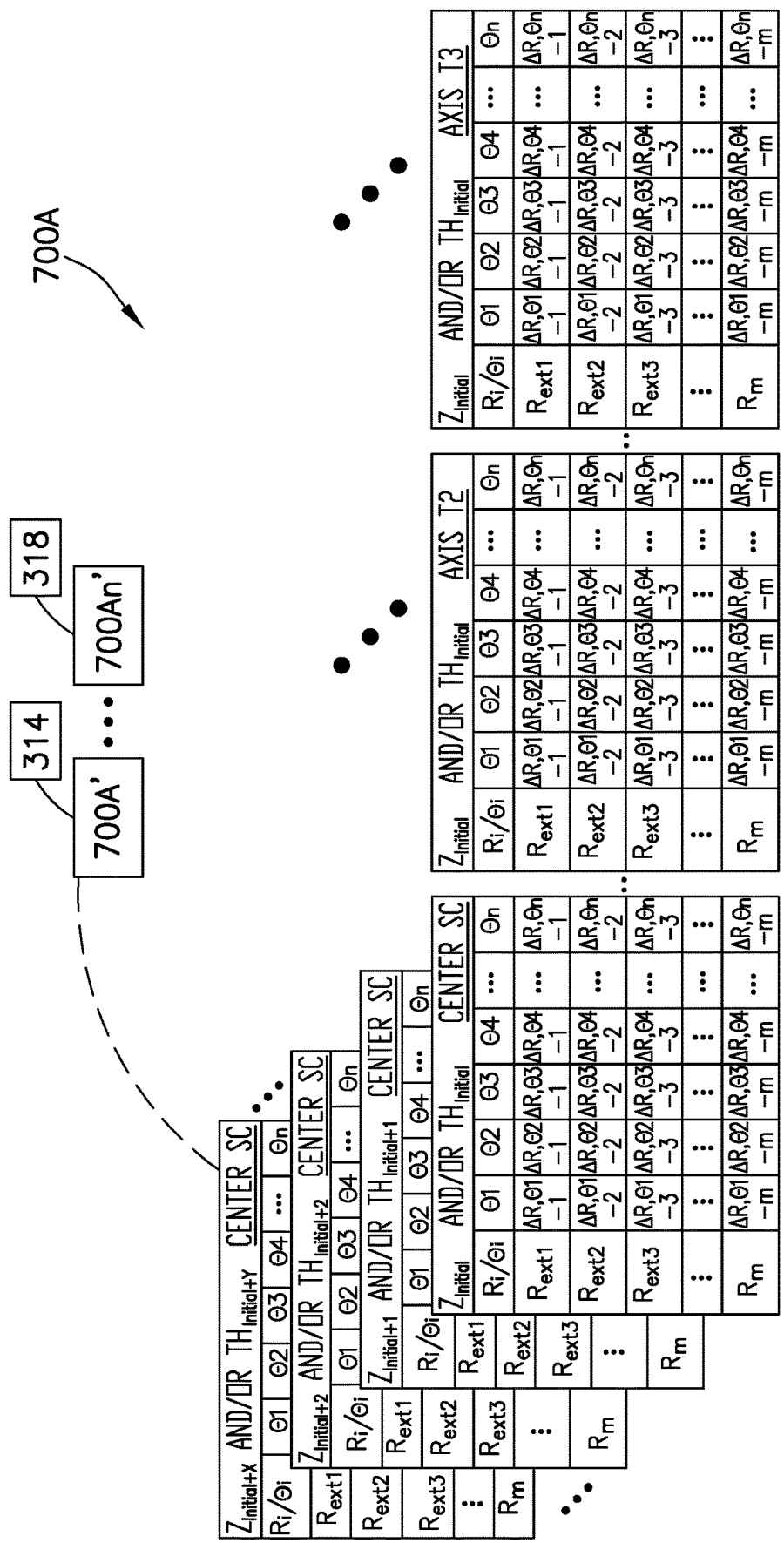
FIG. 7A is a schematic illustration of a droop registration in accordance with aspects of the disclosed embodiment.

By way of further example, with reference now to FIG. 7A, an arm droop distance register 700A is provided. In one aspect empiric droop distance DRP measurements may be stored in the arm droop distance register 700A that has the form of a look up table similar to that previously described. The lookup table(s) as shown in FIG. 7A may be combined or compounded with the lookup table(s) in FIG. 7 to form a compound three dimensional space arm droop algorithm for each degree of freedom of the arm. In one aspect, the arm droop distance register 700A includes an extension position $R_{ext1-m}$ of the transport arm 315 at, for example, the center SC of the substrate S carried on the end effector 315E, the rotation axis T3 of the wrist W of the transport arm 315, the rotation axis T2 of the elbow of the transport arm 315, plotted against the extension angle $\theta_{1-n}$ of the transport arm 315 (in other aspects, the extension position of the transport arm 315 may be determined from any other suitable feature of the transport arm 315 or substrate S). In one aspect, $R_{ext1}$ corresponds to the retracted position of the transport at the respective angle $\theta_{1-n}$ while $R_m$ corresponds to the position of the transport arm 315 at the second position 2030B (or subsequent position different from the retracted position of the arm). Here each extension position $R_{ext1}$-$R_m$ (there may be any suitable number of extension positions) corresponds to the sampling locations of the empiric droop measurement DRP. In one aspect, the ΔR distance unit increment (FIG. 4C) between the extension positions $R_{ext1}$-$R_m$ may be substantially constant while in other aspects, the ΔR distance unit increment may be variable to, for example, provide greater definition in predetermined areas of the droop mapping (e.g. along predetermined areas of the axis of extension and retraction R1-R8). In one aspect, the angles $\theta_{1-n}$ correspond to axes of extension and retraction R1-R8 to different substrate holding locations; however, in other aspects, there may be any suitable number of angles along which the empiric droop DRP is measured.

In one aspect, the controller 2020C is configured to extend the transport arm 315 along axis of extension and retraction R1 at angle θ1 by driving the drive section 200 in any suitable manner. As the transport arm 315 extends the sensing devices 2021 measure the R, θ positions ΔR,θ1-1 to ΔR,θ1-m of, for example, the center SC of the substrate S, the rotation axis T3 of the wrist W, the rotation axis T2 of the elbow, or any other suitable feature of the transport arm 315 or substrate S at the extension positions $R_{ext1}$-$R_m$. The empiric arm droop DRP distances ΔR,θ1-1 to ΔR,θ1-m are registered (FIG. 6, Block 630) in the controller in any suitable manner, such as in the arm droop distance register 700A. The controller 2020C is further configured to rotate the transport arm 315 so that the end effector 315E is positioned to extend along another axis of extension and retraction R2 at angle θ2 where Blocks 620 and 630 of FIG. 6 are repeated to obtain empiric droop DRP distances ΔR,θ2-1 to ΔR,θ2-m for registration in the arm droop distance register 700A. Droop distance measurements are taken at each angle $\theta_{1-n}$ and for every extension position $R_{ext1-m}$, in the manner described above, so that the corresponding empiric droop DRP is measured and is represented in the arm droop distance register 700A, e.g., as ΔR,θ1-1 to ΔR,θ1-m for angle θ1 to ΔR,θn-1 to ΔR,θn-m for angle θn. Here the arm droop distance register 700A describes the empiric arm droop distance DRP at the first arm position 2030A, the second arm position 2030B and at a third arm position 2030C (and subsequent arm positions 2030D-2030P), where the third arm position 2030C (and subsequent arm positions 2030D-2030P) are different from both the first arm position 2030A and the second arm position 2030B, where the end effector 315E is moved along at least one axis of motion (in this example, the extension axis R of motion, but in other aspects in the T direction along the θ axis of motion and/or along the Z axis of motion). It is noted that the arm droop distance register 700A is illustrated with droop distance measurements (ΔR,θ1-1 to ΔR,θ1-m for angle θ1 to ΔR,θn-1 to ΔR,θn-m for angle θn) which may correspond to the center SC of the substrate S, the rotation axis T3 of the wrist W of the transport arm 315, and the rotation axis T2 the elbow of the transport arm 315, but it should be understood that in other aspects, arm droop distance register 700A may also include droop distance measurements for the leading edge SLE and/or the trailing edge SLT of the substrate S, or any other suitable feature of the transport arm 315.

As can be seen in FIG. 7A, the arm droop distance register 700A may not only be a two-dimensional array correlating the empiric droop distance DRP with an extension distance $R_{ext1}$-$R_m$ but can also be configured so as to compensate for different environmental conditions (e.g. such as different operating temperatures TH) in which the transport apparatus 104 operates and/or to compensate for extension of the arm at different positions of the transport arm 315 along the Z axis. For example, blocks 620 and 630 of FIG. 6 may be repeated for any suitable number of different temperatures $TH_{initial}$-$TH_{initial+y}$ so that the droop compensation described by the arm droop distance register 700A and the arm droop compensation (described herein) effected thereby accommodates for, e.g., thermal expansion and contraction of the arm components (e.g. arm links, pulleys, belts, end effector, etc.). Blocks 620 and 630 of FIG. 6 may also be repeated for any suitable number of different Z heights $Z_{initial}$-$Z_{initial+x}$ so that the arm droop distance register 700A and the droop compensation effected thereby (described herein) accommodates for, e.g., misalignment between the Z axis of the transport apparatus 104 and the coaxial spindle of the drive section 200 and/or for misalignment between the drive shafts of the coaxial drive section 200, 200A-200C to which the transport arm 315 is coupled. In still further aspects, where the transport apparatus 104 includes interchangeable arms 314, 315, 316, 317, 318 an arm droop distance register 700A, 700A'-700An' may be created for each of the interchangeable arms 314, 315, 316, 317, 318 in the manner described above.

As may be realized, arm droop distance registers 700A-700An' may be created in a manner similar to that described above with respect to aspects where the transport arm 2004 is mounted to the boom arm 143 or linear slide 144. Here the boom arm 143 or linear slide 144, with the transport arm 2004 mounted thereto, may be mounted to the frame 2000F of the substrate transport arm droop mapping apparatus 2000 in a manner substantially similar to that described above, where the registration system 2020 determines the droop distance of the transport arm 2004 mounted to the boom arm 143 or linear slide 144 in a manner similar to that described above with respect to the axes of extension and retraction R such as shown in FIGS. 1C and 1D so that the empiric droop distance DRP effected by both the transport arm 2004 and the boom arm 143 or linear slide 144 is registered in a corresponding arm droop register 700A.

In one aspect, referring to FIGS. 4A-4D, and 7A, as well as FIGS. 1A-1M and 2A-2D, the arm droop distance register(s) 700A, as described above, travel with the respective transport apparatus 2004 (and the different selectable arms 314, 315, 316, 317, 318 if so equipped). In one aspect, the arm droop distance register(s) 700A for the transport apparatus 2004 is/are transferred (e.g. loaded into in any suitable manner) to a droop compensator 110DC of the controller 110 for the processing apparatus 100A-100H in which the transport apparatus 2004 is to be used. In one aspect, the droop compensator 110DC may be disposed within the housing of the drive section 200, 200A-200C and coupled to the controller 110 in any suitable manner for effecting arm droop compensation as described herein. The controller 110 is then configured to effect, with the drive section 200, 200A-200C of the transport apparatus 2004, a compensating motion of the transport arm 2004, such as transport arm 315, where the compensating motion has a magnitude and direction compensating for and resolving the empiric droop distance DRP of the transport arm 315 substantially in its entirety. In one aspect, using processing apparatus 100A of FIG. 1A as an example, the droop compensator 110DC of controller 110 is configured in any suitable manner to determine the empiric droop distance DRP of the transport arm 315, from the droop distance register(s) 700A, between the first position 2030A and the second position 2030B, the second position 2030B in this example, being a location of slot valve SV. In one aspect, the magnitude and direction of the compensating motion is determined from the droop distance register(s) 700A.

In accordance with one or more aspects of the disclosed embodiment a substrate transport arm empiric droop mapping apparatus for a substrate transport system of a processing tool is provided. The mapping apparatus comprises:

a frame;

an interface disposed on the frame forming datum features representative of a substrate transport space in the processing tool defined by the substrate transport system;

a substrate transport arm, that is articulated and has a substrate holder, mounted to the frame in a predetermined relation to at least one of the datum features; and a registration system disposed with respect to the substrate transport arm and at least one datum feature so that the registration system registers, in an arm droop distance register, empiric arm droop distance, due to arm droop changes, between a first arm position and a second arm position different than the first arm position and in which the substrate holder is moved in the transport space along at least one axis of motion.

In accordance with one or more aspects of the disclosed embodiment the arm droop distance register describes the empiric arm droop distance at the first arm position and second arm position and at a third arm position, different from both first and second arm positions, wherein the substrate holder is moved along the at least one axis of motion.

In accordance with one or more aspects of the disclosed embodiment the arm droop distance register is embodied so as to define a curve describing arm droop distance variation relative to arm positions wherein the substrate holder is moved along the at least one axis of motion.

In accordance with one or more aspects of the disclosed embodiment the curve describes arm droop distance variation relative to arm positions wherein the substrate holder is moved along more than one different axis of motion defining a transfer plane or a transfer volume in the substrate transport space.

In accordance with one or more aspects of the disclosed embodiment the curve describes discrete arm droop distance variation relative to arm positions for substrate holder motion along each of the more than one different axis of motion.

In accordance with one or more aspects of the disclosed embodiment the arm droop distance register is embodied as a data look up table or algorithm.

In accordance with one or more aspects of the disclosed embodiment the at least one axis of motion is an extension axis of the substrate transport arm at least in each quadrant of the substrate transport space surrounding the substrate transport arm, or at least a rotation axis of the substrate transport arm, or at least a lift axis of the substrate transport arm.

In accordance with one or more aspects of the disclosed embodiment the substrate transport arm is mounted with a drive section, having a co-axial drive spindle driving arm motion.

In accordance with one or more aspects of the disclosed embodiment the substrate transport arm is selectable from a number of different interchangeable transport arms, each of which has a different corresponding arm droop distance register registered by the registration system of the apparatus, each register describing empiric arm droop distance specific to the corresponding transport arm.

In accordance with one or more aspects of the disclosed embodiment a method comprises:

providing a frame with an interface disposed on the frame, the interface forming datum features representative of a substrate transport space, in a processing tool, defined by a substrate transport system of the processing tool;

mounting a substrate transport arm to the frame in a predetermined relation to at least one of the datum features, the substrate transport arm being an articulated arm and having a substrate holder; and registering, in an arm droop register, an empiric arm droop distance, with a registration system disposed with respect to the substrate transport arm and at least one datum feature, due to arm droop changes, between a first arm position and a second arm position different than the first arm position and in which the substrate holder is moved in the transport space along at least one axis of motion.

In accordance with one or more aspects of the disclosed embodiment the arm droop distance register describes the empiric arm droop distance at the first arm position and second arm position and at a third arm position, different from both first and second arm positions, wherein the substrate holder is moved along the at least one axis of motion.

In accordance with one or more aspects of the disclosed embodiment the arm droop distance register is embodied so as to define a curve describing arm droop distance variation relative to arm positions wherein the substrate holder is moved along the at least one axis of motion.

In accordance with one or more aspects of the disclosed embodiment the curve describes the arm droop distance variation relative to arm positions wherein the substrate holder is moved along more than one different axis of motion defining a transfer plane or a transfer volume in the substrate transport space.

In accordance with one or more aspects of the disclosed embodiment the curve describes discrete arm droop distance variation relative to arm positions for substrate holder motion along each of the more than one different axis of motion.

In accordance with one or more aspects of the disclosed embodiment the arm droop distance register is embodied as a data look up table or algorithm.

In accordance with one or more aspects of the disclosed embodiment the at least one axis of motion is an extension axis of the substrate transport arm at least in each quadrant of the substrate transport space surrounding the substrate transport arm, or at least a rotation axis of the substrate transport arm, or at least a lift axis of the substrate transport arm.

In accordance with one or more aspects of the disclosed embodiment the substrate transport arm is mounted with a drive section, having a co-axial drive spindle driving arm motion.

In accordance with one or more aspects of the disclosed embodiment the further comprises selecting the substrate transport arm from a number of different interchangeable transport arms, each of which has a different corresponding arm droop distance register registered by the registration system, each register describing empiric arm droop distance specific to the corresponding transport arm.

In accordance with one or more aspects of the disclosed embodiment a substrate transport apparatus comprises:

a frame;

a drive section connected to the frame;

a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and a controller operably connected to the drive section so as to effect articulation of the transport arm, the controller comprising an arm droop compensator configured so that the arm droop compensator resolves an empiric droop distance of the transport arm, due to transport arm droop, between the first position and second position.

In accordance with one or more aspects of the disclosed embodiment the controller effects, with the drive section, a compensating motion of the transport arm in magnitude and direction compensating for and resolving the empiric droop distance of the transport arm substantially in its entirety.

In accordance with one or more aspects of the disclosed embodiment the compensator has an arm droop distance register, and the arm droop compensator determines the empiric droop distance of the transport arm between the first position and the second position from the arm droop distance register.

In accordance with one or more aspects of the disclosed embodiment the controller effects with the drive section a compensating motion of the transport arm in magnitude and direction compensating for and resolving the empiric droop distance of the transport arm, determined from the arm droop distance register, substantially in its entirety.

In accordance with one or more aspects of the disclosed embodiment the compensating motion results in cancellation of the empiric droop distance of the transport arm, with respect to a predetermined reference datum, substantially in its entirety so that the substrate holder at a predetermined location in the transport space is at a net position, in the direction in which the arm droop is manifested, that is independent of the transport arm droop.

In accordance with one or more aspects of the disclosed embodiment the predetermined location is a substrate destination location in a substrate process tool.

In accordance with one or more aspects of the disclosed embodiment the controller effects the compensating motion so that the substrate holder completes motion reaching the predetermined location substantially at the net position.

In accordance with one or more aspects of the disclosed embodiment the controller effects the compensation motion with arm motion moving the substrate holder between the first position and the second position along an optimal path with a time optimum trajectory.

In accordance with one or more aspects of the disclosed embodiment the drive section and transport arm are configured so that motion of the transport arm has more than one degree of freedom, and the arm droop distance register describes the empiric arm droop distance throughout the transport space formed by the more than one degree of freedom of the motion of the transport arm.

In accordance with one or more aspects of the disclosed embodiment the transport arm is interchangeable from a number of different interchangeable transport arms so as to be swapped at the connection with the drive section, each of the interchangeable arms having a different arm droop characteristic and a corresponding droop distance register associated therewith describing empiric arm droop distance of the associated arm.

In accordance with one or more aspects of the disclosed embodiment a substrate processing tool is provided with the substrate transport apparatus as described herein, and having a substrate holding station, disposed to interface with a substrate on the substrate holder at a predetermined location in the transport space, that is positioned so that the interface is effected independent of the transport arm droop.

In accordance with one or more aspects of the disclosed embodiment a substrate processing tool is provided with the substrate transport apparatus as described herein, and having a predetermined structure that interacts with the transport arm or substrate holder and is disposed so that the interaction is effected independent of the transport arm droop.

In accordance with one or more aspects of the disclosed embodiment a substrate processing tool comprises:

a frame;

a drive section connected to the frame;

a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and a controller operably connected to the drive section so as to effect articulation of the transport arm, the controller being configured to effect with the drive section motion of the arm, in an opposite direction to a direction in which arm droop is manifested, compensating for the arm droop so as to substantially cancel in entirety of an empiric arm droop distance, relative to a predetermine reference datum, due to arm droop between the first position and second position.

In accordance with one or more aspects of the disclosed embodiment the controller has an arm droop distance register, and the controller determines the empiric arm droop distance of the transport arm between the first position and the second position from the arm droop distance register.

In accordance with one or more aspects of the disclosed embodiment the drive section and transport arm are configured so that motion of the transport arm has more than one degree of freedom, and the arm droop distance register describes the empiric arm droop distance throughout the transport space formed by the more than one degree of freedom of the motion of the transport arm.

In accordance with one or more aspects of the disclosed embodiment the transport arm is interchangeable from a number of different interchangeable transport arms so as to be swapped at the connection with the drive section, each of the interchangeable arms having a different arm droop characteristic and a corresponding arm droop distance register associated therewith describing empiric arm droop distance of the associated arm.

In accordance with one or more aspects of the disclosed embodiment the compensating motion results in cancellation of the empiric arm droop distance of the transport arm, with respect to a predetermined reference datum, substantially in its entirety so that the substrate holder at a predetermined location in the transport space is at a net position, in the direction in which the arm droop is manifested, that is independent of the arm droop.

In accordance with one or more aspects of the disclosed embodiment the predetermined location is a substrate destination location in a substrate process tool.

In accordance with one or more aspects of the disclosed embodiment the controller effects the motion of the transport arm, in the opposite direction to the direction in which the arm droop is manifested so that the substrate holder completes motion reaching the predetermined location substantially at the net position.

In accordance with one or more aspects of the disclosed embodiment the controller effects the motion of the transport arm, in the opposite direction to the direction in which arm droop is manifested with arm motion moving the substrate holder between the first position and the second position along an optimal path with a time optimum trajectory.

In accordance with one or more aspects of the disclosed embodiment a method comprises:

providing a substrate transport apparatus having a drive section connected to a frame and a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and resolving an empiric droop distance of the transport arm, due to transport arm droop, between the first position and the second position, where the empiric droop distance of the transport arm between the first position and the second position is determined from an arm droop distance register of an arm droop compensator that resides within a controller connected to the drive section so as to effect articulation of the transport arm.

In accordance with one or more aspects of the disclosed embodiment the controller effects, with the drive section, a compensating motion of the transport arm in magnitude and direction compensating for and resolving the empiric droop distance of the transport arm substantially in its entirety.

In accordance with one or more aspects of the disclosed embodiment the arm droop compensator has an arm droop distance register, the method further comprising determining, with the arm droop compensator, the empiric droop distance of the transport arm between the first position and the second position from the arm droop distance register.

In accordance with one or more aspects of the disclosed embodiment the controller effects with the drive section a compensating motion of the transport arm in magnitude and direction compensating for and resolving the empiric droop distance of the transport arm, determined from the arm droop distance register, substantially in its entirety.

In accordance with one or more aspects of the disclosed embodiment the compensating motion results in cancellation of the empiric droop distance of the transport arm, with respect to a predetermined reference datum, substantially in its entirety so that the substrate holder at a predetermined location in the transport space is at a net position, in the direction in which the transport arm droop is manifested, that is independent of the transport arm droop.

In accordance with one or more aspects of the disclosed embodiment the predetermined location is a substrate destination location in a substrate process tool.

In accordance with one or more aspects of the disclosed embodiment the controller effects the compensating motion so that the substrate holder completes motion reaching the predetermined location substantially at the net position.

In accordance with one or more aspects of the disclosed embodiment the controller effects the compensation motion with arm motion moving the substrate holder between the first position and the second position along an optimal path with a time optimum trajectory.

In accordance with one or more aspects of the disclosed embodiment the drive section and transport arm are configured so that motion of the transport arm has more than one degree of freedom, the method further comprising, describing, with the arm droop distance register, the empiric arm droop distance throughout the transport space formed by the more than one degree of freedom of the motion of the transport arm.

In accordance with one or more aspects of the disclosed embodiment the transport arm is interchangeable from a number of different interchangeable transport arms so as to be swapped at the connection with the drive section, each of the interchangeable arms having a different arm droop characteristic and a corresponding arm droop distance register associated therewith describing empiric arm droop distance of the associated arm.

In accordance with one or more aspects of the disclosed embodiment a substrate transport arm droop mapping apparatus for a substrate transport system of a processing tool is provided. The mapping apparatus comprises:

a frame;

an interface disposed on the frame forming datum features representative of a substrate transport space in the processing tool defined by the substrate transport system;

a substrate transport arm, that is articulated and has a substrate holder, mounted to the frame in a predetermined relation to at least one of the datum features; and a registration system disposed with respect to the substrate transport arm and at least one datum feature so that the registration system registers, in an arm droop register, an uncommanded arm displacement distance, due to uncommanded arm geometry changes, between a first arm position and a second arm position different than the first arm position and in which the substrate holder is moved in the transport space along at least one axis of motion.

In accordance with one or more aspects of the disclosed embodiment the empiric arm droop distance describes the uncommanded arm displacement distance at the first arm position and second arm position and at a third arm position, different from both first and second arm positions, wherein the substrate holder is moved along the at least one axis of motion.

In accordance with one or more aspects of the disclosed embodiment the arm droop register is embodied so as to define a curve describing uncommanded arm displacement distance variation relative to arm positions wherein the substrate holder is moved along the at least one axis of motion.

In accordance with one or more aspects of the disclosed embodiment the curve describes uncommanded arm displacement distance variation relative to arm positions wherein the substrate holder is moved along more than one different axis of motion defining a transfer plane or a transfer volume in the substrate transport space.

In accordance with one or more aspects of the disclosed embodiment the curve describes discrete uncommanded arm displacement distance variation relative to arm positions for substrate holder motion along each of the more than one different axis of motion.

In accordance with one or more aspects of the disclosed embodiment the arm droop register is embodied as a data look up table or algorithm.

In accordance with one or more aspects of the disclosed embodiment the at least one axis of motion is an extension axis of the substrate transport arm at least in each quadrant of the substrate transport space surrounding the substrate transport arm, or at least a rotation axis of the substrate transport arm, or at least a lift axis of the substrate transport arm.

In accordance with one or more aspects of the disclosed embodiment the substrate transport arm is mounted with a drive section, having a co-axial drive spindle driving arm motion.

In accordance with one or more aspects of the disclosed embodiment the substrate transport arm is selectable from a number of different interchangeable transport arms, each of which has a different corresponding arm droop register registered by the registration system of the apparatus, each register describing uncommanded arm displacement distance specific to the corresponding transport arm.

In accordance with one or more aspects of the disclosed embodiment a method comprises:

providing a frame with an interface disposed on the frame, the interface forming datum features representative of a substrate transport space, in a processing tool, defined by a substrate transport system of the processing tool;

mounting a substrate transport arm to the frame in a predetermined relation to at least one of the datum features, the substrate transport arm being an articulated arm and having a substrate holder; and registering, in an arm droop register, an uncommanded arm displacement distance, with a registration system disposed with respect to the substrate transport arm and at least one datum feature, due to uncommanded arm geometry changes, between a first arm position and a second arm position different than the first arm position and in which the substrate holder is moved in the transport space along at least one axis of motion.

In accordance with one or more aspects of the disclosed embodiment the arm droop register describes the uncommanded arm displacement distance at the first arm position and second arm position and at a third arm position, different from both first and second arm positions, wherein the substrate holder is moved along the at least one axis of motion.

In accordance with one or more aspects of the disclosed embodiment the arm droop register is embodied so as to define a curve describing uncommanded arm displacement distance variation relative to arm positions wherein the substrate holder is moved along the at least one axis of motion.

In accordance with one or more aspects of the disclosed embodiment the curve describes the uncommanded arm displacement distance variation relative to arm positions wherein the substrate holder is moved along more than one different axis of motion defining a transfer plane or a transfer volume in the substrate transport space.

In accordance with one or more aspects of the disclosed embodiment the curve describes discrete uncommanded arm displacement distance variation relative to arm positions for substrate holder motion along each of the more than one different axis of motion.

In accordance with one or more aspects of the disclosed embodiment the arm droop register is embodied as a data look up table or algorithm.

In accordance with one or more aspects of the disclosed embodiment the at least one axis of motion is an extension axis of the substrate transport arm at least in each quadrant of the substrate transport space surrounding the substrate transport arm, or at least a rotation axis of the substrate transport arm, or at least a lift axis of the substrate transport arm.

In accordance with one or more aspects of the disclosed embodiment the substrate transport arm is mounted with a drive section, having a co-axial drive spindle driving arm motion.

In accordance with one or more aspects of the disclosed embodiment the method further comprises selecting the substrate transport arm from a number of different interchangeable transport arms, each of which has a different corresponding arm droop register registered by the registration system, each register describing uncommanded arm displacement distance specific to the corresponding transport arm.

In accordance with one or more aspects of the disclosed embodiment a substrate transport apparatus comprises:

a frame;

a drive section connected to the frame;

a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and a controller operably connected to the drive section so as to effect articulation of the transport arm, the controller comprising an arm droop compensator configured so that the arm droop compensator resolves an uncommanded arm displacement distance of the transport arm, due to uncommanded arm geometry changes, between the first position and second position.

In accordance with one or more aspects of the disclosed embodiment the controller effects, with the drive section, a compensating motion of the transport arm in magnitude and direction compensating for and resolving the uncommanded arm displacement distance of the transport arm substantially in its entirety.

In accordance with one or more aspects of the disclosed embodiment the compensator has an arm droop register, and the arm droop compensator determines the uncommanded arm displacement distance of the transport arm between the first position and the second position from the arm droop register.

In accordance with one or more aspects of the disclosed embodiment the controller effects with the drive section a compensating motion of the transport arm in magnitude and direction compensating for and resolving the uncommanded arm displacement distance of the transport arm, determined from the arm droop register, substantially in its entirety.

In accordance with one or more aspects of the disclosed embodiment the compensating motion results in cancellation of the uncommanded arm displacement distance of the transport arm, with respect to a predetermined reference datum, substantially in its entirety so that the substrate holder at a predetermined location in the transport space is at a net position, in the direction in which the uncommanded arm displacement is manifested, that is independent of the uncommanded arm geometry changes.

In accordance with one or more aspects of the disclosed embodiment the predetermined location is a substrate destination location in a substrate process tool.

In accordance with one or more aspects of the disclosed embodiment the controller effects the compensating motion so that the substrate holder completes motion reaching the predetermined location substantially at the net position.

In accordance with one or more aspects of the disclosed embodiment the controller effects the compensation motion with arm motion moving the substrate holder between the first position and the second position along an optimal path with a time optimum trajectory.

In accordance with one or more aspects of the disclosed embodiment the drive section and transport arm are configured so that motion of the transport arm has more than one degree of freedom, and the arm droop register describes the uncommanded arm displacement distance throughout the transport space formed by the more than one degree of freedom of the motion of the transport arm.

In accordance with one or more aspects of the disclosed embodiment the transport arm is interchangeable from a number of different interchangeable transport arms so as to be swapped at the connection with the drive section, each of the interchangeable arms having a different arm droop characteristic and a corresponding droop register associated therewith describing uncommanded arm displacement distance of the associated arm.

In accordance with one or more aspects of the disclosed embodiment a substrate processing tool is provided with the substrate transport apparatus as described herein, and having a substrate holding station, disposed to interface with a substrate on the substrate holder at a predetermined location in the transport space, that is positioned so that the interface is effected independent of the uncommanded arm geometry changes.

In accordance with one or more aspects of the disclosed embodiment a substrate processing tool is provided with the substrate transport apparatus as described herein, and having a predetermined structure that interacts with the transport arm or substrate holder and is disposed so that the interaction is effected independent of the uncommanded arm geometry changes.

In accordance with one or more aspects of the disclosed embodiment substrate processing tool comprises:
 a frame;
 a drive section connected to the frame;
 a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and
 a controller operably connected to the drive section so as to effect articulation of the transport arm, the controller being configured to effect with the drive section motion of the arm, in an opposite direction to a direction in which arm droop is manifested, compensating for the arm droop so as to substantially cancel in entirety of an uncommanded arm displacement distance, relative to a predetermine reference datum, due to uncommanded arm geometry changed between the first position and second position.

In accordance with one or more aspects of the disclosed embodiment the controller has an arm droop register, and the controller determines the uncommanded arm displacement distance of the transport arm between the first position and the second position from the arm droop register.

In accordance with one or more aspects of the disclosed embodiment the drive section and transport arm are configured so that motion of the transport arm has more than one degree of freedom, and the arm droop register describes the uncommanded arm displacement distance throughout the transport space formed by the more than one degree of freedom of the motion of the transport arm.

In accordance with one or more aspects of the disclosed embodiment the transport arm is interchangeable from a number of different interchangeable transport arms so as to be swapped at the connection with the drive section, each of the interchangeable arms having a different arm droop characteristic and a corresponding arm droop register associated therewith describing uncommanded arm displacement distance of the associated arm.

In accordance with one or more aspects of the disclosed embodiment the compensating motion results in cancellation of the uncommanded arm displacement distance of the transport arm, with respect to a predetermined reference datum, substantially in its entirety so that the substrate holder at a predetermined location in the transport space is at a net position, in the direction in which the arm droop is manifested, that is independent of the arm droop.

In accordance with one or more aspects of the disclosed embodiment the predetermined location is a substrate destination location in a substrate process tool.

In accordance with one or more aspects of the disclosed embodiment the controller effects the motion of the transport arm, in the opposite direction to the direction in which the arm droop is manifested so that the substrate holder completes motion reaching the predetermined location substantially at the net position.

In accordance with one or more aspects of the disclosed embodiment the controller effects the motion of the transport arm, in the opposite direction to the direction in which arm droop is manifested with arm motion moving the substrate holder between the first position and the second position along an optimal path with a time optimum trajectory.

In accordance with one or more aspects of the disclosed embodiment a method comprises:
 providing a substrate transport apparatus having a drive section connected to a frame and a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and
 resolving an uncommanded arm displacement distance of the transport arm, due to uncommanded arm geometry changes, between the first position and the second position, where the uncommanded arm displacement distance of the transport arm between the first position and the second position is determined from an arm droop register of an arm droop compensator that resides within a controller connected to the drive section so as to effect articulation of the transport arm.

In accordance with one or more aspects of the disclosed embodiment the controller effects, with the drive section, a compensating motion of the transport arm in magnitude and direction compensating for and resolving the uncommanded arm displacement distance of the transport arm substantially in its entirety.

In accordance with one or more aspects of the disclosed embodiment the arm droop compensator has an arm droop register, the method further comprising determining, with the arm droop compensator, the uncommanded arm displacement distance of the transport arm between the first position and the second position from the arm droop distance register.

In accordance with one or more aspects of the disclosed embodiment the controller effects with the drive section a compensating motion of the transport arm in magnitude and direction compensating for and resolving the uncommanded arm displacement distance of the transport arm, determined from the arm droop register, substantially in its entirety.

In accordance with one or more aspects of the disclosed embodiment the compensating motion results in cancellation of the uncommanded arm displacement distance of the transport arm, with respect to a predetermined reference datum, substantially in its entirety so that the substrate holder at a predetermined location in the transport space is at a net position, in the direction in which the uncommanded arm geometry changes are manifested, that is independent of the uncommanded arm geometry changes.

In accordance with one or more aspects of the disclosed embodiment the predetermined location is a substrate destination location in a substrate process tool.

In accordance with one or more aspects of the disclosed embodiment the controller effects the compensating motion so that the substrate holder completes motion reaching the predetermined location substantially at the net position.

In accordance with one or more aspects of the disclosed embodiment the controller effects the compensation motion with arm motion moving the substrate holder between the first position and the second position along an optimal path with a time optimum trajectory.

In accordance with one or more aspects of the disclosed embodiment the drive section and transport arm are configured so that motion of the transport arm has more than one degree of freedom, the method further comprising, describing, with the arm droop register, the uncommanded arm displacement distance throughout the transport space formed by the more than one degree of freedom of the motion of the transport arm.

In accordance with one or more aspects of the disclosed embodiment the transport arm is interchangeable from a number of different interchangeable transport arms so as to be swapped at the connection with the drive section, each of the interchangeable arms having a different arm droop characteristic and a corresponding arm droop register associated therewith describing uncommanded arm displacement distance of the associated arm.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
   a frame;
   a drive section connected to the frame;
   a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and
   a controller operably connected to the drive section so as to effect articulation of the transport arm, the controller comprising an arm droop compensator configured so that the arm droop compensator resolves an empiric droop distance of the transport arm, due to transport arm droop, between the first position and second position.

2. The substrate transport apparatus of claim 1, wherein the controller effects, with the drive section, a compensating motion of the transport arm in magnitude and direction compensating for and resolving the empiric droop distance of the transport arm substantially in its entirety.

3. The substrate transport apparatus of claim 1, wherein the compensator has an arm droop distance register, and the arm droop compensator determines the empiric droop distance of the transport arm between the first position and the second position from the arm droop distance register.

4. The substrate transport apparatus of claim 3, wherein the controller effects with the drive section a compensating motion of the transport arm in magnitude and direction compensating for and resolving the empiric droop distance of the transport arm, determined from the arm droop distance register, substantially in its entirety.

5. The substrate transport apparatus of claim 4, wherein the compensating motion results in cancellation of the empiric droop distance of the transport arm, with respect to a predetermined reference datum, substantially in its entirety so that the substrate holder at a predetermined location in the transport space is at a net position, in the direction in which the arm droop is manifested, that is independent of the transport arm droop.

6. The substrate transport apparatus of claim 5, wherein the predetermined location is a substrate destination location in a substrate process tool.

7. The substrate transport apparatus of claim 5, wherein the controller effects the compensating motion so that the substrate holder completes motion reaching the predetermined location substantially at the net position.

8. The substrate transport apparatus of claim 5, wherein the controller effects the compensation motion with arm motion moving the substrate holder between the first position and the second position along an optimal path with a time optimum trajectory.

9. The substrate transport apparatus of claim 3, wherein the drive section and transport arm are configured so that motion of the transport arm has more than one degree of freedom, and the arm droop distance register describes the empiric arm droop distance throughout the transport space formed by the more than one degree of freedom of the motion of the transport arm.

10. The substrate transport apparatus of claim 3, wherein the transport arm is interchangeable from a number of different interchangeable transport arms so as to be swapped at the connection with the drive section, each of the interchangeable arms having a different arm droop characteristic and a corresponding droop distance register associated therewith describing empiric arm droop distance of the associated arm.

11. A substrate processing tool with the substrate transport apparatus of claim 10, and having a substrate holding station, disposed to interface with a substrate on the substrate holder at a predetermined location in the transport space, that is positioned so that the interface is effected independent of the transport arm droop.

12. A substrate processing tool with the substrate transport apparatus of claim 10, and having a predetermined structure that interacts with the transport arm or substrate holder and is disposed so that the interaction is effected independent of the transport arm droop.

13. A substrate processing tool comprising:
   a frame;
   a drive section connected to the frame;
   a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and
   a controller operably connected to the drive section so as to effect articulation of the transport arm, the controller being configured to effect with the drive section motion of the arm, in an opposite direction to a direction in which arm droop is manifested, compensating for the arm droop so as to substantially cancel in entirety of an empiric arm droop distance, relative to a predetermine reference datum, due to arm droop between the first position and second position.

14. The substrate transport tool of claim 13, wherein the controller has an arm droop distance register, and the controller determines the empiric arm droop distance of the transport arm between the first position and the second position from the arm droop distance register.

15. The substrate transport tool of claim 14, wherein the drive section and transport arm are configured so that motion of the transport arm has more than one degree of freedom, and the arm droop distance register describes the empiric arm droop distance throughout the transport space formed by the more than one degree of freedom of the motion of the transport arm.

16. The substrate transport tool of claim 14, wherein the transport arm is interchangeable from a number of different interchangeable transport arms so as to be swapped at the connection with the drive section, each of the interchangeable arms having a different arm droop characteristic and a corresponding arm droop distance register associated therewith describing empiric arm droop distance of the associated arm.

17. The substrate transport tool of claim 13, wherein the compensating motion results in cancellation of the empiric arm droop distance of the transport arm, with respect to a predetermined reference datum, substantially in its entirety so that the substrate holder at a predetermined location in the transport space is at a net position, in the direction in which the arm droop is manifested, that is independent of the arm droop.

18. The substrate transport tool of claim 17, wherein the predetermined location is a substrate destination location in a substrate process tool.

19. The substrate transport tool of claim 17, wherein the controller effects the motion of the transport arm, in the opposite direction to the direction in which the arm droop is manifested so that the substrate holder completes motion reaching the predetermined location substantially at the net position.

20. The substrate transport tool of claim 13, wherein the controller effects the motion of the transport arm, in the opposite direction to the direction in which arm droop is manifested with arm motion moving the substrate holder between the first position and the second position along an optimal path with a time optimum trajetory.

21. A method comprising:
providing a substrate transport apparatus having a drive section connected to a frame and a transport arm, operably connected to the drive section, the arm being articulated and having an end effector, with a substrate holder, movable relative to the frame between a first position and a second position, different from the first position, in a transport space defined by articulation of the transport arm along at least one axis of motion relative to the frame; and resolving an empiric droop distance of the transport arm, due to transport arm droop, between the first position and the second position, where the empiric droop distance of the transport arm between the first position and the second position is determined from an arm droop distance register of an arm droop compensator that resides within a controller connected to the drive section so as to effect articulation of the transport arm.

22. The method of claim 21, wherein the controller effects, with the drive section, a compensating motion of the transport arm in magnitude and direction compensating for and resolving the empiric droop distance of the transport arm substantially in its entirety.

23. The method of claim 21, wherein the arm droop compensator has an arm droop distance register, the method further comprising determining, with the arm droop compensator, the empiric droop distance of the transport arm between the first position and the second position from the arm droop distance register.

24. The method of claim 23, wherein the controller effects with the drive section a compensating motion of the transport arm in magnitude and direction compensating for and resolving the empiric droop distance of the transport arm, determined from the arm droop distance register, substantially in its entirety.

25. The method of claim 24, wherein the compensating motion results in cancellation of the empiric droop distance of the transport arm, with respect to a predetermined reference datum, substantially in its entirety so that the substrate holder at a predetermined location in the transport space is at a net position, in the direction in which the transport arm droop is manifested, that is independent of the transport arm droop.

26. The method of claim 25, wherein the predetermined location is a substrate destination location in a substrate process tool.

27. The method of claim 25, wherein the controller effects the compensating motion so that the substrate holder completes motion reaching the predetermined location substantially at the net position.

28. The method of claim 25, wherein the controller effects the compensation motion with arm motion moving the substrate holder between the first position and the second position along an optimal path with a time optimum trajectory.

29. The method of claim 23, wherein the drive section and transport arm are configured so that motion of the transport arm has more than one degree of freedom, the method further comprising, describing, with the arm droop distance register, the empiric arm droop distance throughout the transport space formed by the more than one degree of freedom of the motion of the transport arm.

30. The method of claim 23, wherein the transport arm is interchangeable from a number of different interchangeable transport arms so as to be swapped at the connection with the drive section, each of the interchangeable arms having a different arm droop characteristic and a corresponding arm droop distance register associated therewith describing empiric arm droop distance of the associated arm.

* * * * *